(12) United States Patent
Doogue et al.

(10) Patent No.: US 8,952,471 B2
(45) Date of Patent: *Feb. 10, 2015

(54) ARRANGEMENTS FOR AN INTEGRATED SENSOR

(71) Applicant: Allegro Microsystems, LLC, Worcester, MA (US)

(72) Inventors: Michael C. Doogue, Manchester, NH (US); William P. Taylor, Amherst, NH (US); Vijay Mangtani, Nashua, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/918,064

(22) Filed: Jun. 14, 2013

(65) Prior Publication Data

US 2013/0277782 A1    Oct. 24, 2013

Related U.S. Application Data

(62) Division of application No. 12/792,245, filed on Jun. 2, 2010, now Pat. No. 8,629,520, which is a division of application No. 11/335,944, filed on Jan. 20, 2006, now Pat. No. 7,768,083.

(51) Int. Cl.
    *H01L 29/82*      (2006.01)
    *H01L 43/08*      (2006.01)
    (Continued)

(52) U.S. Cl.
    CPC ............ *H01L 43/08* (2013.01); *B82Y 25/00* (2013.01); *G01R 15/207* (2013.01); *G01R 33/02* (2013.01); *G01R 33/07* (2013.01); *G01R 33/09* (2013.01); *G01R 33/093* (2013.01);
    (Continued)

(58) Field of Classification Search
    CPC ....... G01R 15/207; G01R 33/07; G01R 33/09
    USPC .................................. 257/422, 427, E29.323
    See application file for complete search history.

(56) References Cited

U.S. PATENT DOCUMENTS

| 4,283,643 A | 8/1981 | Levin |
| 4,343,026 A | 8/1982 | Griffith et al. |

(Continued)

FOREIGN PATENT DOCUMENTS

| CH | 683469 A5 | 3/1994 |
| DE | 42 12 737 C1 | 7/1993 |

(Continued)

OTHER PUBLICATIONS

Letter from Yuasa and Hara; dated Sep. 25, 2013; for JP Pat. App. No. 2008-551281; 1 page.

(Continued)

*Primary Examiner* — Daniel Whalen
(74) *Attorney, Agent, or Firm* — Daly, Crowley, Mofford & Durkee, LLP

(57) ABSTRACT

An integrated circuit can have a first substrate supporting a magnetic field sensing element and a second substrate supporting another magnetic field sensing element. The first and second substrates can be arranged in a variety of configurations. Another integrated circuit can have a first magnetic field sensing element and second different magnetic field sensing element disposed on surfaces thereof.

9 Claims, 8 Drawing Sheets

(51) Int. Cl.
*B82Y 25/00* (2011.01)
*G01R 15/20* (2006.01)
*G01R 33/02* (2006.01)
*G01R 33/07* (2006.01)
*G01R 33/09* (2006.01)
*H01L 25/16* (2006.01)

(52) U.S. Cl.
CPC .... *H01L 25/162* (2013.01); *H01L 2224/48091* (2013.01); *H01L 2224/48137* (2013.01); *H01L 2224/48247* (2013.01); *H01L 2924/3025* (2013.01)
USPC .................. 257/422; 257/427; 257/E29.323

(56) References Cited

U.S. PATENT DOCUMENTS

| | | |
|---|---|---|
| 4,385,273 A | 5/1983 | Leinhard et al. |
| 4,525,668 A | 6/1985 | Lienhard et al. |
| 4,596,950 A | 6/1986 | Lienhard et al. |
| 4,691,259 A | 9/1987 | Imakoshi |
| 4,712,064 A | 12/1987 | Eckardt et al. |
| 4,772,929 A | 9/1988 | Manchester |
| 4,823,075 A | 4/1989 | Alley |
| 4,847,584 A | 7/1989 | Pant |
| 4,893,027 A | 1/1990 | Kammerer et al. |
| 4,922,606 A | 5/1990 | Alexander et al. |
| 4,926,116 A | 5/1990 | Talisa |
| 4,937,521 A | 6/1990 | Yoshino et al. |
| 4,939,448 A | 7/1990 | Gudel |
| 4,939,449 A | 7/1990 | Cattaneo et al. |
| 4,939,459 A | 7/1990 | Akachi et al. |
| 5,041,780 A | 8/1991 | Rippel |
| 5,049,809 A | 9/1991 | Wakatsuki et al. |
| 5,055,785 A | 10/1991 | Shintaku et al. |
| 5,218,279 A | 6/1993 | Takahashi et al. |
| 5,227,721 A | 7/1993 | Kataoka et al. |
| 5,247,202 A | 9/1993 | Popovic et al. |
| 5,351,027 A | 9/1994 | Kawamata et al. |
| 5,442,283 A | 8/1995 | Vig et al. |
| 5,500,590 A | 3/1996 | Pant |
| 5,561,366 A | 10/1996 | Takahashi et al. |
| 5,561,368 A | 10/1996 | Dovek et al. |
| 5,570,034 A | 10/1996 | Needham et al. |
| 5,583,725 A | 12/1996 | Coffey et al. |
| 5,621,377 A | 4/1997 | Dettmann et al. |
| 5,686,838 A | 11/1997 | van den Berg |
| 5,686,879 A | 11/1997 | Schuhl et al. |
| 5,719,494 A | 2/1998 | Dettmann et al. |
| 5,831,426 A | 11/1998 | Black, Jr. et al. |
| 5,877,705 A | 3/1999 | Sampey |
| 5,883,567 A | 3/1999 | Mullins, Jr. |
| 5,896,030 A | 4/1999 | Hasken |
| 5,945,825 A | 8/1999 | Clemens |
| 5,952,825 A | 9/1999 | Wan |
| 6,002,553 A | 12/1999 | Stearns et al. |
| 6,031,273 A | 2/2000 | Torok et al. |
| 6,094,330 A | 7/2000 | Criniti et al. |
| 6,100,686 A | 8/2000 | Van Delden et al. |
| 6,175,296 B1 | 1/2001 | Tokunaga et al. |
| 6,184,679 B1 | 2/2001 | Popovic et al. |
| 6,191,581 B1 | 2/2001 | Van Dau et al. |
| 6,300,617 B1 | 10/2001 | Daughton et al. |
| 6,310,470 B1 | 10/2001 | Hebing et al. |
| 6,315,875 B1 | 11/2001 | Sasaki |
| 6,316,931 B1 | 11/2001 | Nakagawa et al. |
| 6,323,634 B1 | 11/2001 | Nakagawa et al. |
| 6,329,818 B1 | 12/2001 | Tokunaga et al. |
| 6,331,773 B1 | 12/2001 | Engel |
| 6,356,068 B1 | 3/2002 | Steiner et al. |
| 6,392,852 B1 | 5/2002 | Sasaki |
| 6,404,191 B2 | 6/2002 | Daughton et al. |
| 6,411,078 B1 | 6/2002 | Nakagawa et al. |
| 6,424,018 B1 | 7/2002 | Ohtsuka |
| 6,426,620 B1 | 7/2002 | Taguchi et al. |
| 6,429,640 B1 | 8/2002 | Daughton et al. |
| 6,433,981 B1 | 8/2002 | Fletcher et al. |
| 6,437,558 B2 | 8/2002 | Li et al. |
| 6,445,171 B2 | 9/2002 | Sandquist et al. |
| 6,459,255 B1 | 10/2002 | Tamai et al. |
| 6,462,531 B1 | 10/2002 | Ohtsuka |
| 6,462,541 B1 | 10/2002 | Wang et al. |
| 6,501,678 B1 | 12/2002 | Lenssen et al. |
| 6,542,375 B1 | 4/2003 | Kuitenbrouwer et al. |
| 6,545,457 B2 | 4/2003 | Goto et al. |
| 6,566,856 B2 | 5/2003 | Sandquist et al. |
| 6,583,629 B1 | 6/2003 | Stokes et al. |
| 6,591,481 B2 | 7/2003 | Shimazawa et al. |
| 6,642,705 B2 | 11/2003 | Kawase |
| 6,657,826 B2 | 12/2003 | Shimazawa et al. |
| 6,667,682 B2 | 12/2003 | Wan et al. |
| 6,683,448 B1 | 1/2004 | Ohtsuka |
| 6,721,140 B2 | 4/2004 | Inoue et al. |
| 6,759,841 B2 | 7/2004 | Goto et al. |
| 6,769,166 B1 | 8/2004 | Blanchard |
| 6,781,358 B2 | 8/2004 | Goto et al. |
| 6,781,359 B2 | 8/2004 | Stauth et al. |
| 6,791,313 B2 | 9/2004 | Ohtsuka |
| 6,812,687 B1 | 11/2004 | Ohtsuka |
| 6,815,944 B2 | 11/2004 | Vig et al. |
| 6,841,989 B2 | 1/2005 | Goto et al. |
| 6,970,333 B2 | 11/2005 | Boeve |
| 6,989,665 B2 | 1/2006 | Goto |
| 6,995,957 B2 | 2/2006 | Jayasekara |
| 7,026,808 B2 | 4/2006 | Vig et al. |
| 7,075,287 B1 | 7/2006 | Mangtani et al. |
| 7,106,046 B2 | 9/2006 | Nagano et al. |
| 7,166,807 B2 | 1/2007 | Gagnon et al. |
| 7,248,045 B2 | 7/2007 | Shoji |
| 7,259,545 B2 | 8/2007 | Stauth et al. |
| 7,336,064 B2 | 2/2008 | Ludwig et al. |
| 7,358,724 B2 | 4/2008 | Taylor et al. |
| 7,476,953 B2 | 1/2009 | Taylor et al. |
| 7,495,624 B2 | 2/2009 | Daalmans |
| 7,518,354 B2 | 4/2009 | Stauth et al. |
| 7,723,983 B2 | 5/2010 | Shoji |
| 7,746,056 B2 | 6/2010 | Stauth et al. |
| 7,768,083 B2 * | 8/2010 | Doogue et al. ............... 257/422 |
| 7,816,905 B2 | 10/2010 | Doogue et al. |
| 2002/0067162 A1 | 6/2002 | Dammkohler et al. |
| 2002/0067172 A1 | 6/2002 | Alker |
| 2002/0084105 A1 | 7/2002 | Geng et al. |
| 2002/0093332 A1 | 7/2002 | Schroeder et al. |
| 2002/0180433 A1 | 12/2002 | Van Zon et al. |
| 2003/0151406 A1 | 8/2003 | Wan et al. |
| 2004/0023064 A1 | 2/2004 | Ehresmann et al. |
| 2004/0155644 A1 | 8/2004 | Stauth et al. |
| 2004/0184196 A1 | 9/2004 | Jayasekara |
| 2005/0045359 A1 | 3/2005 | Doogue et al. |
| 2005/0246114 A1 | 11/2005 | Rannow et al. |
| 2005/0258820 A1 | 11/2005 | Forster |
| 2006/0033487 A1 | 2/2006 | Nagano et al. |
| 2006/0071655 A1 | 4/2006 | Shoji |
| 2006/0077598 A1 | 4/2006 | Taylor et al. |
| 2006/0091993 A1 | 5/2006 | Shoji |
| 2006/0114098 A1 | 6/2006 | Shoji |
| 2006/0145690 A1 | 7/2006 | Shoji |
| 2006/0170529 A1 | 8/2006 | Shoji |
| 2006/0175674 A1 | 8/2006 | Taylor et al. |
| 2006/0255797 A1 | 11/2006 | Taylor et al. |
| 2006/0284611 A1 | 12/2006 | Ishio |
| 2006/0291106 A1 | 12/2006 | Shoji |
| 2007/0044370 A1 | 3/2007 | Shoji |
| 2007/0076332 A1 | 4/2007 | Shoji et al. |
| 2007/0090825 A1 | 4/2007 | Shoji |
| 2007/0096716 A1 | 5/2007 | Shoji |
| 2007/0170533 A1 | 7/2007 | Doogue et al. |
| 2007/0247146 A1 | 10/2007 | Stauth et al. |
| 2009/0295368 A1 | 12/2009 | Doogue et al. |
| 2009/0315543 A1 | 12/2009 | Guo et al. |
| 2010/0237450 A1 * | 9/2010 | Doogue et al. ............... 257/427 |

(56) References Cited

U.S. PATENT DOCUMENTS

FOREIGN PATENT DOCUMENTS

| | | |
|---|---|---|
| DE | 196 50 078 A1 | 6/1998 |
| DE | 10017374 B4 | 12/2000 |
| DE | 101 08 640 A1 | 9/2002 |
| DE | 10159607 A1 | 9/2002 |
| DE | 10128150 C1 | 1/2003 |
| DE | 10155423 B4 | 5/2003 |
| DE | 10202287 C1 | 8/2003 |
| DE | 102 22 395 A1 | 12/2003 |
| DE | 103 14 602 A1 | 10/2004 |
| DE | 102 004003369 A1 | 8/2005 |
| DE | 102 004009267 B3 | 9/2005 |
| DE | 102 004038847 B3 | 9/2005 |
| DE | 10 2004 017 191 A1 | 10/2005 |
| DE | 196 80 089 | 11/2005 |
| DE | 10 2004 021 862 A1 | 12/2005 |
| DE | 102 004040079 B3 | 12/2005 |
| DE | 102 005037905 A1 | 3/2006 |
| DE | 102 004053551 A1 | 5/2006 |
| DE | 102 006008257 A1 | 10/2006 |
| DE | 10 2006 028 520 | 1/2007 |
| DE | 102 006021774 A1 | 1/2007 |
| DE | 102 005038655 B3 | 3/2007 |
| DE | 102 005040539 B4 | 3/2007 |
| DE | 102 005052688 A1 | 5/2007 |
| DE | 102 006007770 A1 | 8/2007 |
| DE | 102 006028698 B3 | 12/2007 |
| DE | 102 006046736 B4 | 4/2008 |
| DE | 102 006046739 B4 | 4/2008 |
| EP | 0 539 081 A1 | 4/1993 |
| EP | 0 710 850 A2 | 5/1996 |
| EP | 0 710 850 A3 | 5/1996 |
| EP | 1 225 453 A2 | 7/2002 |
| EP | 1 443 332 A1 | 8/2004 |
| EP | 1 202 024 B1 | 3/2005 |
| EP | 1 691 204 A1 | 8/2006 |
| EP | 1 865 331 A2 | 12/2007 |
| GB | 2 352 522 A | 1/2001 |
| JP | S57-105977 | 6/1982 |
| JP | 57187671 | 11/1982 |
| JP | SHO58(1983)-155761 | 6/1983 |
| JP | 58-155761 | 9/1983 |
| JP | 62-43260 | 3/1987 |
| JP | 63-150384 | 10/1988 |
| JP | 63/263782 A | 10/1988 |
| JP | 64-075969 | 3/1989 |
| JP | H02-16475 | 1/1990 |
| JP | H02-170061 (A) | 6/1990 |
| JP | 2-212789 | 8/1990 |
| JP | Hei 02-238372 | 9/1990 |
| JP | 3-214783 | 9/1991 |
| JP | Hei 05-010979 | 1/1993 |
| JP | 5-264701 | 10/1993 |
| JP | H06-27150 | 2/1994 |
| JP | 08-130338 | 5/1996 |
| JP | 10-142303 | 5/1996 |
| JP | H09-257835 (A) | 3/1997 |
| JP | 9-166612 | 6/1997 |
| JP | 10-142303 | 5/1998 |
| JP | H10-307156 (A) | 11/1998 |
| JP | 2000-514920 | 11/2000 |
| JP | 2001-227902 | 8/2001 |
| JP | 2001-230598 | 8/2001 |
| JP | 2002-82136 | 3/2002 |
| JP | 2002-107382 | 4/2002 |
| JP | 2003-43074 | 2/2003 |
| JP | 2006/514283 | 4/2003 |
| JP | 2003-215171 | 7/2003 |
| JP | 2004-158668 | 6/2004 |
| JP | 2004/356338 A | 12/2004 |
| JP | 2005-195427 (A) | 7/2005 |
| JP | 2005-253216 | 9/2005 |
| JP | 2004 568309 | 11/2005 |
| JP | 2007-503584 | 2/2007 |
| JP | 2007-536689 | 4/2007 |
| WO | WO 96/22542 | 7/1996 |
| WO | WO 03/019216 A1 | 3/2003 |
| WO | WO 03/107018 A1 | 12/2003 |
| WO | WO 2004/071672 A1 | 8/2004 |
| WO | WO 2004/109725 | 12/2004 |
| WO | WO 2006/044031 A1 | 4/2006 |
| WO | WO 2006/083479 A1 | 8/2006 |
| WO | WO 2006/017727 A1 | 11/2006 |
| WO | WO 2006/136577 A1 | 12/2006 |
| WO | WO 2007/087121 A2 | 8/2007 |
| WO | WO 2007/087121 A3 | 8/2007 |
| WO | WO 2007/147760 A2 | 12/2007 |
| WO | WO 2007/147760 A3 | 12/2007 |
| WO | WO 2009/148823 A1 | 12/2009 |

OTHER PUBLICATIONS

Japanese Appeal Brief and Amendment (in Japanese); dated Sep. 12, 2013; for JP Pat. App. No. 2008-551281; 11 pages.
Japanese Claims (in English) as filed with Appeal Brief and Amendment; dated Sep. 12, 2013; for JP Pat. App. No. 2008-551281; 2 pages.
Korean Notice of Allowance (with English Translation) dated Nov. 20, 2013; for Korean Pat. App. No. 10-2008-7018642; 3 pages.
Korean Allowed Claims (English translation) dated Nov. 20, 2013; for Korean Pat. App. No. 10-2008-7018642; 17 pages.
Letter to 21$^{st}$ Century Patent & Law Firm; dated Jun. 25, 2013 for KR Pat. App. No. 10-2008-7148642; 4 pages.
Korean Response to Office Action; filed Jul. 17, 2013; for KR Pat. App. No. 10-2008-7148642; 19 pages.
Letter to NTD Patent and Trademark Agency Ltd.; dated Jun. 24, 2013; regarding Chinese Pat. App. No. 200980115608.6; 8 pages.
Letter from NTC Patent and Trademark Agency Ltd.; dated Jul. 22, 2013; regarding Chinese Pat. App. No. 200980115608.6; 1 page.
Chinese Response to Office Action; received Jul. 22, 2013; to Chinese Office Action dated May 2, 2013; for Chinese Pat. App. No. 200980115608.6; 8 pages.
Letter from Yuasa and Hara dated Nov. 12, 2013; for Japanese Pat. No. 2011-511715; 2 pages.
Japanese Argument and Amendment filed Oct. 23, 2013; for Japanese Pat. No. 2011-511715; 2 pages.
Japanese Claims filed with Japanese Argument and Amendment filed on Oct. 23, 2013; for Japanese Pat. No. 2011-511715; 3 pages.
Chinese Notice of Completing Formalities for Patent Registration and Notice of Granting Patent Right for Invention; dated Aug. 1, 2013; for Chinese Pat. App. No. 200980115608.6; 2 pages.
Chinese Notice of Completing Formalities for Patent Registration and Notice of Granting Patent Right for Invention (English translation); dated Aug. 1, 2013; for Chinese Pat. App. No. 200980115608.6; 2 pages.
Notice of Allowance; dated Sep. 16, 2013; for U.S. Appl. No. 12/792,245; 11 pages.
Letter from Yuasa & Hara; dated Apr. 25, 2013; for Japanese Pat. App. No. 2011-264267; 4 pages.
Japanese Response to Notification of Rejection; filed on Apr. 16, 2013; for Japanese Pat. App. No. 2011-264267; 6 pages.
Letter from Yuasa & Hara; dated Aug. 21, 2013; for Japanese Pat. App. No. 2011-264267; 2 pages.
Japanese Notification of Reason for Rejection; dated Aug. 19, 2013; for Japanese Pat. App. No. 2011-264267; 3 pages.
Letter from Yuasa & Hara; dated May 29, 2013; for Japanese Pat. App. No. 2008-551281; 3 pages.
Japanese Decision for Rejection; dated May 16, 2013, for Japanese Pat. App. No. 2008-551281; 1 page.
Japanese Decision for Declining of Amendment; dated Sep. 27, 2012; for Japanese Pat. App. No. 2008-551281; 2 page.
Letter from A.A. Thornton & Co. to the European Patent Office; dated Aug. 8, 2013; for European Pat. App. No. 194223; 1 page.
European Response to the Opposition by Micronas GmbH; received Aug. 9, 2013; for European Pat. App. No. 194223; 14 pages.
Letter from A.A. Thornton & Co. to the European Patent Office; dated Aug. 8, 2013; for European Pat. App. No. 2290379; 1 page.

(56) References Cited

OTHER PUBLICATIONS

European Response to the Opposition by Micronas GmbH; received Aug. 9, 2013; for European Pat. App. No. 2290379; 15 pages.
Letter from A.A. Thornton & Co. to the European Patent Office; dated Aug. 12, 2013; for European Pat. App. No. 2290980; 1 page.
European Response to the Opposition by Micronas GmbH; received Aug. 12, 2013; for European Pat. App. No. 2290980; 10 pages.
Letter from A.A. Thornton & Co. to the European Patent Office; dated Aug. 8, 2013; for European Pat. App. No. 2290381; 1 page.
European Response to the Opposition by Micronas GmbH; received Aug. 9, 2013; for European Pat. App. No. 2290381; 9 pages.
IEEE 100; "The Authoritative Dictionary of IEEE Standards Terms, Seventh Edition;" Feb. 27, 2007; 3 sheets.
Data Sheet; "High-Speed Digital Isolators, AduM1100AR/AduM1100BR;" as published by Analog Devices, Inc.; 2001, pp. 1-12.
Mexelis Integrated Systems; "CSA-1V Current Sensor;" www.melexis.com/ProdMain.aspx?nID=614; Aug. 2007; 2 sheets.
Mitsui High Tec; "IC Leadframes;" downloaded on Sep. 23, 2011; http://mitsui-high-tec.com/en/prd/lf/index.html; 2 sheets.
Partin et al.; "Temperature Stable Hall Effect Sensors;" IEEESensors Journal, vol. 6, No. 1; Feb. 2006; pp. 106-110.
PC Magazine Encyclopedia; "Definition of lead frame;" data sheet downloaded Sep. 23, 2011; http://www.pcmag.com/encyclopedia_term/0,2542,t=lead+frame&i=45990,00.asp; 2 sheets.
Pernia et al.; "Characteristics and Design of a Current Sensor Using Multilayer Co/Ni Structures;" IEEE, 1998 pp. 414-419.
Sentron A Melexis Company; "Operation and Application of the Sentron CAS-1V-SO Surface Mount Current Sensor;" Current Sensing with the CSA-1V Hall IC, AN_102; Aug. 2004; pp. 1-14.
Siliconfareast.com; "Lead Frames;" date sheet downloaded on Sep. 23, 2011; http://www.siliconfareast.com/leadframes.htm; 2 sheets.
Takenaga et al.; "High-Temperature Operations of Rotation Angle Sensors with Spin-Valve-Type Magnetic Tunnel Junctions;" IEEE Transactions on Magnetics; vol. 41, No. 10; Oct. 2005; pp. 3628-3630.
Taylor et al.; "A Spin-Valve Based SOIC8 Current Sensor;" Allergo Microsystems, Inc. internal document; Aug. 17, 2006; pp. 1-5.
Wikipedia; "Electronic Compnent;" downloaded Sep. 23, 2011; http://en.wikipedia.org/wiki/Electronic_component; 10 sheets.
Xiao et al.: "An Overview of Integratable Current Sensor Tecnologies;" IEEE Mar. 2003; 0-7803-7883; pp. 1251-1258.
Chinese Office Action dated Sep. 28, 2012; for Chinese Pat. App. No. 200980115608.6; 5 pages.
Chinese Office Action; dated May 2, 2013; for Chinese Pat. App. No. 200980115608.6; 9 pages.
Translation of Chinese Office Action; dated May 2, 2013; for Chinese Pat. App. No. 200980115608.6; 8 pages.
EP Office Action dated Dec. 5, 2008 for EP Pat. App. No. 07716253.5filed on Jul. 10, 2008; 3 sheets.
EP Response to Official Communication dated Dec. 5, 2008 and filed on Jun. 8, 2009 for EP Pat. App. No. 07 716 253.5 filed on Jul. 10, 2008; 15 sheets.
European Office Action dated Apr. 25, 2008 for European Appl. No. 05794713.7; 7 pages.
European Office Action dated Apr. 19, 2011; for EP Pat. App. No. 07716253.5; 4 pages.
European Response to Official Communication dated Apr. 19, 2011; for EP Pat. App. No. 07716253.5; 9 pages.
European Office Action dated Jan. 2, 2011 for EP Pat. App. No. 10195143.2 filed on Dec. 15, 2010.
European Response to Office; dated Mar. 7, 2011; and filed on Sep. 1, 2011 for EP Pat. App. No. 10195143.2; 30 pages.
European Office Action dated Jan. 2, 2011 for EP Pat. App. No. 10195145.7 filed on Dec. 15, 2010.
European Response to Official Communication; dated Mar. 7, 2011; for EP Pat. App. No. 10195143.2; filed on Sep. 1, 2011; 46 pages.
European Office Action dated Feb. 1, 2011 for EP Pat. App. No. 10195147.3 filed on Dec. 15, 2010.
European Response to Office; dated Mar. 7, 2011; and filed on Sep. 1, 2011 for EP Pat. App. No. 10195147.3; 27 pages.
European Notice of Allowance; dated Nov. 8, 2011; for EP Pat. App. No. 07 716 253.5; 7 pages.
European Notice of Allowance; dated Oct. 28, 2011; for EP Pat. App. No. 10 195 143.2; 7 pages.
European Notice of Allowance; dated Oct. 28, 2011; for EP Pat. App. No. 10 195 145.7; 7 pages.
European Notice of Allowance; dated Nov. 14, 2011; for EP Pat. App. No. 10 195 147.3; 7 pages.
Letter from A.A. Thornton & Co.; dated Feb. 20, 2013; with regard to EP Pat. App. No. 07716253.5; 2 pages.
European Notice of Opposition (in German) from the European Patent Office; dated Jan. 14, 2013; with regard to EP Pat. App. No. 07716253.5; 52 pages.
Letter from A.A. Thornton & Co.; dated Feb. 20, 2013; with regard to EP Pat. App. No. 10195143.2; 2 pages.
European Notice of Opposition (in German) from the European Patent Office; dated Jan. 15, 2013; with regard to EP Pat. App. No. 10195143.2; 52 pages.
Letter from A.A. Thornton & Co.; dated Feb. 20, 2013; with regard to EP Pat. App. No. 10195145.7; 2 pages.
European Notice of Opposition (in German) from the European Patent Office; dated Jan. 15, 2013; with regard to EP Pat. App. No. 10195145.7; 26 pages.
Letter from A.A. Thornton & Co.; dated Feb. 20, 2013; with regard to EP Pat. App. No. 10195147.3; 2 pages.
European Notice of Opposition (in German) from the European Patent Office; dated Jan. 15, 2013; with regard to EP Pat. App. No. 10195147.3; 45 pages.
Japanese Office Action dated Mar. 23, 2009 for Japanese Appl. No. 2004-568309 filed Aug. 11, 2005.
Japanese Office Action dated May 26, 2008 for Japanese Appl. No. 2004-568309 filed Aug. 11, 2005.
Japanese Response to Office Action dated May 26, 2008 for Japanese Appl. No. 2004-568309 filed Aug. 11, 2005.
Letter from Yuasa & Hara dated Sep. 16, 2011; for JP Pat. App. No. 2008-551281; 2pages.
JP Office Action; dated Aug. 3, 2011; for JP Pat. App. No. 2008-551281; 4 pages.
Response to JP Official Communication; dated Aug. 3, 3011; for JP Pat. App. No. 2008-551281; 11 pages.
Japanese Office Action dated Jul. 2, 2012; for Japanese Pat. App. No. 2008-551281; 5 pages.
Japanese Response to Office Action filed on Oct. 4, 2012; for Japanese Pat. App. No. 2008-551281; 12 pages.
Japanese Notification of Rejection; dated Oct. 19, 2012; for JP Pat. App. No. 2011-264267; 3 sheets.
Korean Office Action with a Summary of the Office Action in English; dated Nov. 13, 2012; for KR Pat. App. No. 10-2008-7148642; 13 pages.
Letter to 21st Century Patent & Law Firm; dated Dec. 14, 2012; including "DCMD Proposed Amended Claims Beginning from PCT Claims;" for Korean Patent Application No. 10-2008-7018642; 21 pages.
Office Action dated Apr. 16, 2010 from U.S. Appl. No. 12/131,399 17 pages.
Office Action/Restriction Requirement dated May 15, 2008 for U.S. Appl. No. 11/335,944.
Response to Restriction Requirement dated May 15, 2008 for U.S. Appl. No. 11/335,944.
Office Action dated Apr. 6, 2009 for U.S. Appl. No. 11/335,944, filed Jan. 20, 2006; 19 pages.
Response to Office Action dated Apr. 6, 2009 for U.S. Appl. No. 11/335,944, filed Jan. 20, 2006; 17 pages.
Office Action dated May 19, 2011; for U.S. Appl. No. 12/792,245; 21 pages.
Response filed Aug. 16, 2011; to Office Action dated May 19, 2011; for U.S. Appl. No. 12/792,245; 14 pages.
Final Office Action dated Oct. 28, 2011; for U.S. Appl. No. 12/792,245; 23 pages.
Response filed Dec. 29, 2011; to Final Office Action dated Oct. 28, 2011; for U.S. Appl. No. 12/792,245; 14 pages.

(56) References Cited

OTHER PUBLICATIONS

Request for Continued Examination; filed on Feb. 16, 2012; for U.S. Appl. No. 12/792,245; 3 pages.
Office Action dated Mar. 28, 2013; for U.S. Appl. No. 12/792,245; 18 pages.
Response filed Apr. 25, 2013; to Office Action dated Mar. 28, 2013; for U.S. Appl. No. 12/792,245; 21 pages.
Notice of Allowance dated May 31, 2013; for U.S. Appl. No. 12/792,245; 10 pages.
Office Action dated Jan. 25, 2010 for U.S. Appl. No. 12/131,339.
Response to Office Action dated Jan. 25, 2010 and filed on Feb. 16, 2010 for U.S. Appl. No. 12/131,339.
Final Office Action dated Apr. 16, 2010 for U.S. Appl. No. 12/131,339.
Response to Final Office Action dated Apr. 16, 2010 and filed on Jul. 16, 2010 for U.S. Appl. No. 12/131,339.
Notice of Allowance dated Jul. 29, 2010 for U.S. Appl. No. 12/131,339.
PCT Invitation to Pay Additional Fees; PCT Application No. PCT/US03/34141 dated Apr. 23, 2004; 7 pages.
PCT Search Report; PCT Application No. PCT/US03/34141 dated Jun. 17, 2004; 10 pages.
PCT Search Report and Written Opinion of the ISA for PCT/US2005/029982 dated Jan. 18, 2006; 13 pages.
PCT Preliminary Report on Patentability of the ISA for PCT/US2007/000093 dated Jan. 4, 2007; 14 pages.
PCT International Preliminary Examination Report of the ISA for PCT/US2007/000093 dated Jul. 31, 2008.
PCT Search Report and Written Opinion of the ISA for PCT/US2007/000093 dated Feb. 5, 2008; 14 pages.
PCT Search Report and Written Opinion of the ISA dated May 11, 2009; for PCT Pat. App. No. PCT/US2009/044614; 11 pages.
PCT International Preliminary Report on Patentability and Written Opinion dated Dec. 6, 2010 for PCT/US2009/044614.
U.S. Appl. No. 10/962,889, filed Oct. 12, 2004.
U.S. Appl. No. 11/335,944, filed Jan. 20, 2006.
Japanese Notice of Reasons for Rejection; dated Jul. 25, 2013; for Japanese Pat. App. 2011-511715; 5 sheets.
Japanese Notification of Reason for Rejection (English Translation) dated Mar. 6, 2014; for Japanese Pat. App. No. 2013-085409; 3 pages.
Letter from Yuasa and Hara dated Feb. 25, 2014; for Japanese Pat. App. No. 2011-264267; 1 page.
Japanese Argument and Amendment filed Feb. 18, 2014; for Japanese Pat. App. No. 2011-264267; 5 pages.
Claims (English translation) filed in Japanese Argument and Amendment filed Feb. 18, 2014; for Japanese Pat. App. No. 2011-264267; 4 pages.
Notice of Allowance dated May 27, 2014 from U.S. Appl. No. 13/918,064 filed on Jun. 14, 2013.
Japanese Office Action dated May 15, 2014; Application No. 2013-189638.
Japanese Final Decision of Rejection dated May 9, 2014 for Japanese Patent Application No. 2011-511715 3 pages.
Letter to Yuasa and Hara dated Aug. 8, 2014; for Japanese Pat. App. No. 2013-085409; 9 pages.
Letter from Yuasa and Hara dated Sep. 9, 2014; for Japanese Pat. App. No. 2013-085409; 1 page.
Japanese Argument and Amendment filed Aug. 26, 2014; for Japanese Pat. App. No. 2013-085409; 7 pages.
Japanese Pending Amended Claims filed Aug. 26, 2014; for Japanese Pat. App. No. 2013-085409; 5 pages.
Japanese Letter from Yuasa and Hara dated Sep. 19, 2014; for Japanese Pat. App. No. 2011-264267; 1 page.
Office Action dated Sep. 25, 2014; for U.S. Appl. No. 13/918,075 47; pages.
Japanese Notification of Reason for Reaction dated Sep. 26, 2014; for Japanese Pat. App. No. 2008-551281; 2 pages.
Japanese Demand of Appeal and Amendment (with English claims) filed on Sep. 2, 2014; for Japanese Pat. App. No. 2011-511715; 11 pages.
Letter to Yuasa and Hara dated Nov. 11, 2014; for Japanese Pat. App. No. 2013-189638 4 pages.
Letter from Yuasa and Hara dated Nov. 27, 2014; for Japanese Pat. App. No. 2013-189638 1 page.
Japanese Amendment dated Nov. 18, 2014; for Japanese Pat. App. No. 2013-189638 6 pages.
Japanese Pending Claims filed Nov. 18, 2014; for Japanese Pat. App. No. 2013-189638 4 pages.
Japanese Notification of Reseaon for Rejection dated Nov. 18, 2014; for Japanese Pat. App. No. 2014-028213; 3 pages.
Japanese Decision For Rejection (English Translation) dated Nov. 7, 2014; for Japanese Pat. App. No. 2013-085409; 2 pages.

\* cited by examiner

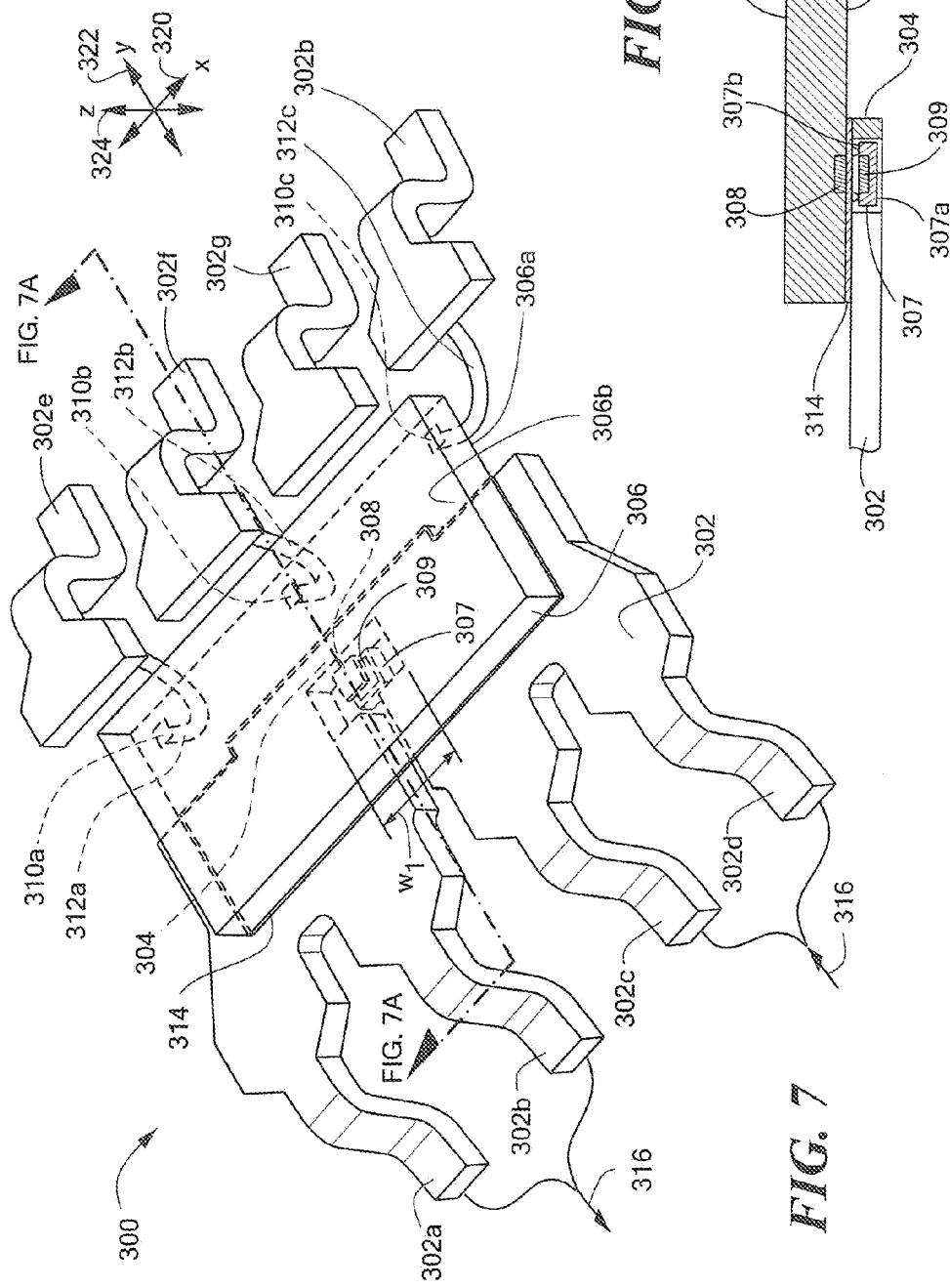

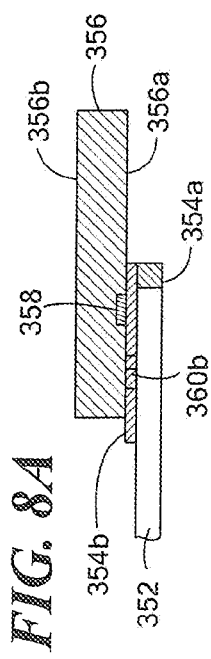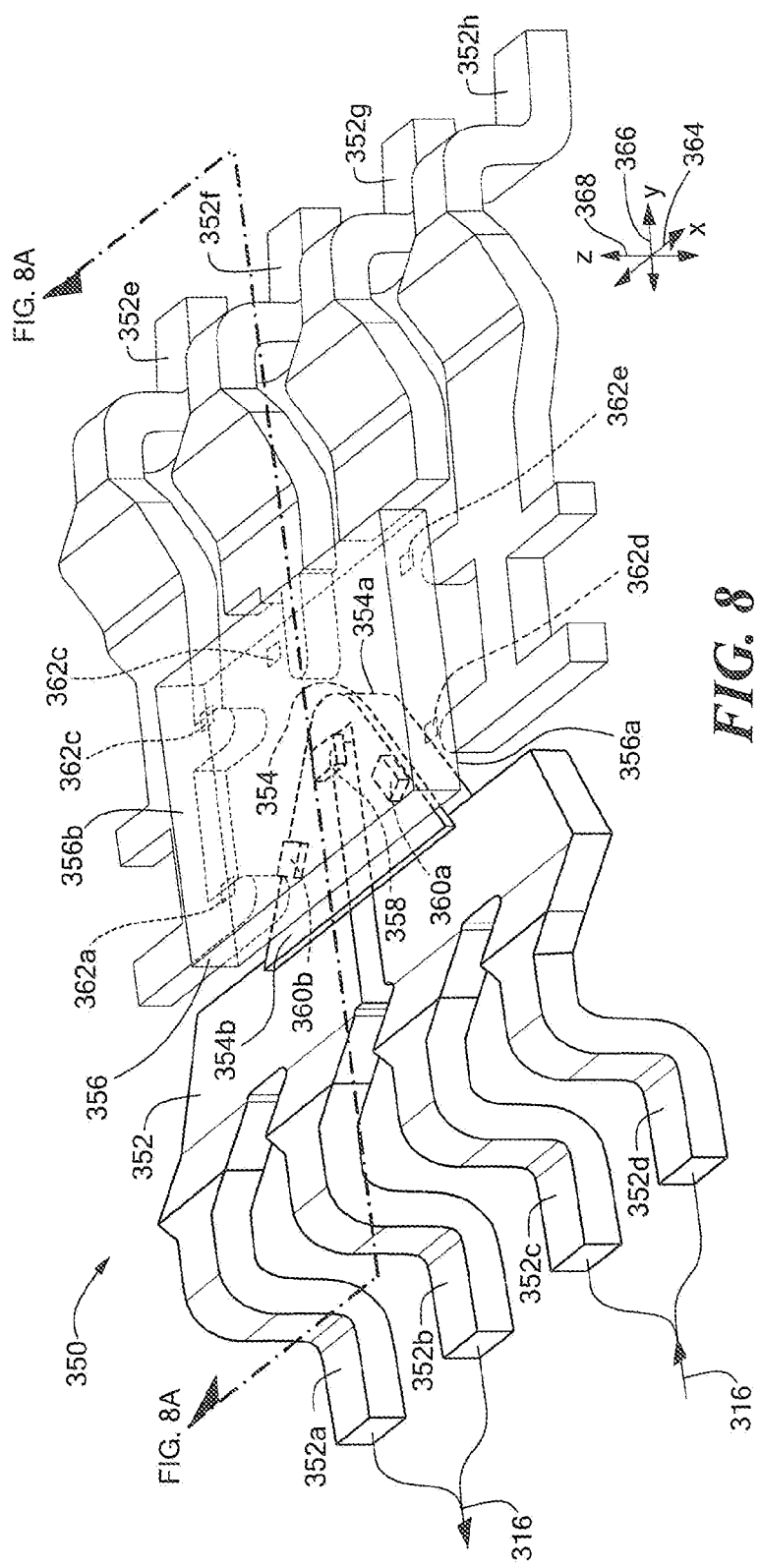

ARRANGEMENTS FOR AN INTEGRATED SENSOR

CROSS REFERENCE TO RELATED APPLICATIONS

This application a Divisional Application of and claims the benefit of U.S. patent application Ser. No. 12/792,245 filed Jun. 2, 2010, which is a Divisional Application of and claims the benefit of U.S. patent application Ser. No. 11/335,944 filed on Jan. 20, 2006, both of which applications are incorporated herein by reference herein in their entirety.

STATEMENT REGARDING FEDERALLY SPONSORED RESEARCH

Not Applicable.

FIELD OF THE INVENTION

This invention relates generally to integrated circuits and, more particularly, to integrated circuits having magnetic sensing elements.

BACKGROUND OF THE INVENTION

As is known in the art, one type of conventional current sensor uses a Hall effect element, which generates a voltage in response to a magnetic field associated with a current passing through a conductor. Typical current sensors of this type include a Hall effect elements mounted on a dielectric material, for example a circuit board. Typically, a ferrous core (flux concentrator) is used in proximity to the Hall effect element.

Another type of conventional current sensor uses a magnetoresistance element, which changes resistance in response to a magnetic field associated with a current passing through a conductor. A fixed electrical current is directed through the magnetoresistance element, thereby generating a voltage output signal proportional to the magnetic field. Conventional current sensors of this type use an anisotropic magnetoresistance (AMR) element mounted on a dielectric material, for example a circuit board.

Various parameters characterize the performance of current sensors, including sensitivity and linearity. Sensitivity is related to a change in the resistance of the magnetoresistance element or a change in output voltage from the Hall effect element in response to a change in magnetic field. Linearity is related to the degree to which the resistance of the magnetoresistance element or the output voltage from the Hall effect element varies in direct linear proportion to the magnetic field.

Various types of magnetic field sensing elements (e.g., Hall effect elements and magnetoresistance elements) are known to have different characteristics, including, but not limited to, different sensitivities, different linearities, and also different hysteresis characteristics in response to a magnetic field. It is also known that a particular type of magnetic field sensing element, for example, a Hall effect element, can have a substantially different sensitivity when fabricated on substrates comprised of different materials, for example, Silicon (Si) and Gallium Arsenide (GaAs).

Typical current sensors tend to be undesirably large, both in terms of height and circuit board area. Typical current sensors also tend to be restricted in dynamic range, i.e., they tend to saturate at large currents, which generate large magnetic fields, and/or they tend to be inaccurate at small sensed currents, which generate small magnetic fields. It would, therefore, be desirable to provide a current sensor having a reduced size, improved accuracy, and/or improved dynamic range.

While conventional current sensors are described above as having particular disadvantages, it will be appreciated that conventional external magnetic field sensors and also conventional electrical signal isolators suffer from the same disadvantages. It would, therefore, be desirable to provide an external magnetic field sensor and also an electrical signal isolator having a reduced size, improved accuracy, and/or improved dynamic range.

SUMMARY OF THE INVENTION

In accordance with the present invention, an integrated circuit includes a lead frame and a first substrate having first and second opposing surfaces. The first substrate is coupled to the lead frame. The integrated circuit also includes a second substrate having first and second opposing surfaces. The first substrate and the second substrate are coupled such that the first surface of the second substrate is proximate to the first surface of the first substrate and the second surface of the second substrate is distal from the second surface of the second substrate. The integrated circuit also includes an electronic component disposed on the first surface of the first substrate and a magnetic field sensing element disposed on the first surface of the second substrate.

In accordance with another aspect of the present invention, an integrated circuit includes a lead frame and a first substrate having first and second opposing surfaces. The first substrate is coupled to the lead frame such that the second surface of the first substrate is above the lead frame and the first surface of the first substrate is above the second surface of the first substrate. The integrated circuit also includes a second substrate having first and second opposing surfaces. The first substrate and the second substrate are coupled such that the second surface of the second surface is above the first surface of the first substrate and the first surface of the second substrate is above the second surface of the second substrate. The integrated circuit also includes an electronic component disposed on the first surface of the first substrate and a magnetic field sensing element disposed on the first surface of the second substrate.

In accordance with another aspect of the present invention, an integrated circuit includes a lead frame and a first substrate having first and second opposing surfaces. The first substrate is coupled to the lead frame such that the second surface of the first substrate is above the lead frame and the first surface of the first substrate is above the second surface of the first substrate. The integrated circuit also includes a second substrate having first and second opposing surfaces. The second substrate is coupled to the lead frame such that the second surface of the second substrate is above the lead frame and the first surface of the second substrate is above the second surface of the second substrate. The integrated circuit also includes an electronic component disposed on the first surface of the first substrate. The integrated circuit also includes a first magnetic field sensing element disposed on the first surface of the second substrate and a second magnetic field sensing element disposed on the first surface of the first substrate.

In accordance with another aspect of the present invention, an integrated circuit includes a lead frame and a base substrate having first and second opposing surfaces. The base substrate is coupled to the lead frame such that the second surface of the base substrate is above the lead frame and the first surface of the base substrate is above the second surface of the base substrate. The integrated circuit also includes a first substrate having first and second opposing surfaces. The first substrate is coupled to the base substrate such that the first surface of the first substrate is above the first surface of the base substrate and the second surface of the first substrate is above the first surface of the first substrate. The integrated circuit also includes a second substrate having first and second opposing surfaces. The second substrate is coupled to the base substrate such that the first surface of the second substrate is above the first surface of the base substrate and the second surface of the second substrate is above the first surface of the second substrate. The integrated circuit also includes an electronic component disposed on the first surface of the first substrate and a magnetic field sensing element disposed on the first surface of the second substrate.

In accordance with another aspect of the present invention, an integrated circuit includes a lead frame and a base substrate having first and second opposing surfaces. The base substrate is coupled to the lead frame such that the second surface of the base substrate is above the lead frame and the first surface of the base substrate is above the second surface of the base substrate. The integrated circuit also includes a first substrate having first and second opposing surfaces. The first substrate is coupled to the base substrate such that the second surface of the first substrate is above the first surface of the base substrate and the first surface of the first substrate is above the second surface of the first substrate. The integrated circuit also includes a second substrate having a first and second opposing surface. The second substrate is coupled to the base substrate such that the second surface of the second substrate is above the first surface of the base substrate and the first surface of the second substrate is above the second surface of the second substrate. The integrated circuit also includes an electronic component disposed on the first surface of the first substrate and a magnetic field sensing element disposed on the first surface of the second substrate.

In accordance with another aspect of the present invention, an integrated circuit includes a first magnetic field sensing element having a first sensitivity to a magnetic field and a second magnetic field sensing element having a second different sensitivity to the magnetic field. The integrated circuit also includes a circuit coupled to the first and second magnetic field sensing elements. The circuit is operable to provide the integrated circuit with a first sensitivity range and a second different sensitivity range in response to the magnetic field.

In accordance with another aspect of the present invention, an integrated circuit includes a first substrate and a circuit element disposed on a surface of the first substrate. The integrated circuit further includes a second substrate coupled to the first substrate and a Hall effect element disposed on a surface of the second substrate.

In accordance with another aspect of the present invention, an integrated circuit includes first substrate and a circuit element disposed on a surface of the first substrate. A Hall effect element is disposed on a surface of the first substrate. The integrated circuit also includes a second substrate coupled to the first substrate and a magnetoresistance element disposed on a surface of the second substrate.

In accordance with another aspect of the present invention, an integrated circuit includes a substrate, a first magnetic field sensing element disposed on a surface of the substrate, and a second different type of magnetic field sensing element disposed on a surface of the substrate.

BRIEF DESCRIPTION OF THE DRAWINGS

The foregoing features of the invention, as well as the invention itself may be more fully understood from the following detailed description of the drawings, in which:

FIG. 1A is a cross-sectional view of the integrated circuit of FIG. 1;

FIG. 2A is a cross-sectional view of the integrated circuit of FIG. 1;

FIG. 7 is a pictorial showing another exemplary integrated current sensor having first and second substrates and having an integrated current-carrying conductor formed by coupling lead frame leads;

FIG. 7A is a cross-sectional view of the integrated circuit of FIG. 7;

FIG. 8 is a pictorial showing another exemplary integrated current sensor having first and second substrates, three magnetic field sensors, and having an integrated current-carrying conductor formed by coupling lead frame leads; and FIG. 8A is a cross-sectional view of the integrated circuit of FIG. 8.

DETAILED DESCRIPTION OF THE INVENTION

Before describing the present invention, some introductory concepts and terminology are explained. As used herein, the term "magnetic field sensing element" is used to describe an electronic component that is responsive to and can be used to measure magnetic fields. The magnetic field sensing element can be of a type including, but not limited to, a Hall effect element and a magnetoresistance element. The Hall effect element can be a horizontal type or a vertical type. The magnetoresistance element can be of a type including, but not limited to, a giant magnetoresistance (GMR) element, an anisotropic magnetoresistance (AMR) element, and a tunneling magnetoresistance (TMR) element.

As used herein, the term "magnetic field sensor" is used to describe an electronic circuit, which includes a magnetic field sensing element, and which is responsive to and can be used to measure a magnetic field. As used herein, the term "current sensor" is used to describe an electronic circuit, which includes a magnetic field sensing element, and which is responsive to and can be used to measure a current in a conductor.

It will be understood herein that a current in a conductor generates a magnetic field circularly disposed about the direction of current. Therefore, the magnetic field sensing element as used in a current sensor can be used to measure the current flowing in a conductor. However, a magnetic field sensing element as used in a magnetic field sensor can be used to measure other magnetic fields, for example a magnetic field associated with the earth.

Figure 1:
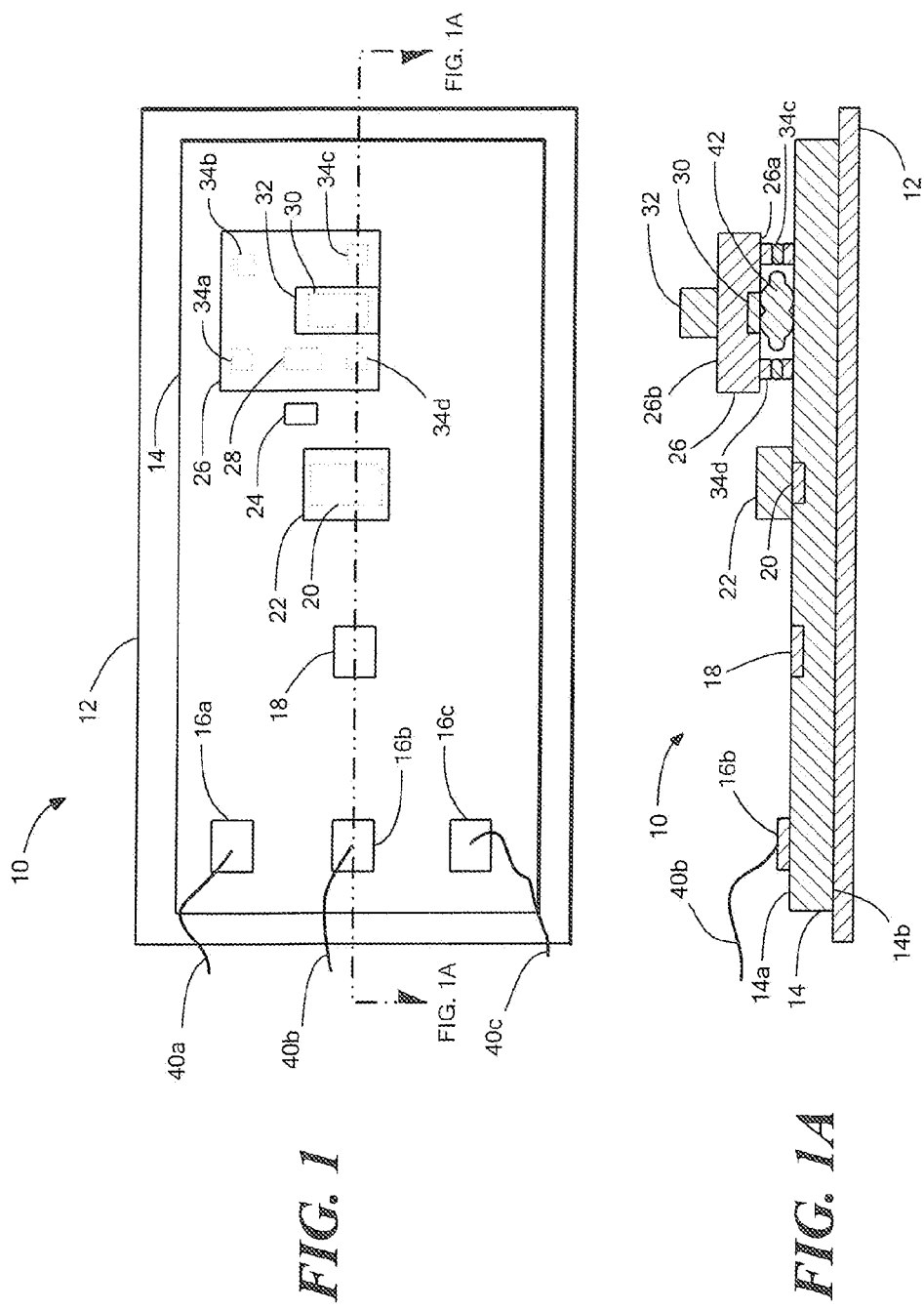
FIG. 1 is a pictorial showing an integrated circuit having first and second substrates, wherein the second substrate is a flip-chip.

Referring to FIGS. 1 and 1A, in which like elements are shown having like reference designations, an exemplary integrated circuit 10 includes a lead frame 12, here shown as only a portion of a lead frame. It will be understood that a lead frame can have a base plate and associated leads. The leads are not shown in FIGS. 1 and 1A.

The integrated circuit 10 also includes a first substrate 14 having first and second opposing surfaces 14a, 14b, respectively. The first substrate 14 is coupled to the lead frame 12 such that the second surface 14b of the first substrate 14 is above the lead frame 12 and the first surface 14a of the first substrate 14 is above the second surface 14b of the first substrate 14.

The integrated circuit 10 also includes a second substrate 26 having first and second opposing surfaces 26a, 26b, respectively. The first substrate 14 and the second substrate 26 are coupled such that the first surface 26a of the second substrate 26 is above the first surface 14a of the first substrate 14 and the second surface 26b of the second substrate 26 is above the first surface 26a of the second substrate 26.

The first and second substrates 14, 26, respectively, can be comprised of a variety of materials including, but not limited to, Si, GaAs, InP, InSb, InGaAs, InGaAsP, SiGe, ceramic, or glass. The first and second substrates 14, 26, respectively, can be comprised of the same material or of different materials. In one particular embodiment, the first substrate 14 is comprised of Silicon (Si) and the second substrate 26 is comprised of Gallium Arsenide (GaAs).

The first surface 26a of the second substrate 26 can be coupled to the first surface 14a of the first substrate 14 with a selected one of a solder ball, a gold bump, a eutectic or high lead solder bump, a no-lead solder bump, a gold stud bump, a polymeric conductive bump, an anisotropic conductive paste, or a conductive film. Four such couplings 34a-34d are shown. However, it will be appreciated that the integrated circuit 10 can have more than four or fewer than four such couplings.

The integrated circuit 10 also includes at least one electronic component 18 disposed on the first surface 14a of the first substrate 14. The electronic component 18 can include, but is not limited to, a passive electronic component, for example, a resistor, capacitor, or inductor, and an active electronic component, for example, a transistor, an amplifier, or another integrated circuit.

The integrated circuit 10 also includes a first magnetic field sensing element 30 disposed on the first surface 26a of the second substrate 26. It will be recognized that this arrangement provides a so-called "flip-chip" arrangement of the second substrate 26 relative to the first substrate 14.

In some embodiments, the integrated circuit 10 further includes a second magnetic field sensing element 20 disposed on the first surface 14a of the first substrate 14. The first and second magnetic field sensing elements 30, 20, respectively, can be selected ones of a Hall effect element and a magnetoresistance element as described above. In some embodiments, the first and second magnetic field sensing elements 30, 20, respectively, are the same type of magnetic field sensing element, and in other embodiments, the first and second magnetic field sensing elements 30, 20, respectively, are different types of magnetic field sensing elements.

In one particular embodiment, the first magnetic field sensing element 30 is a Hall effect element and the second magnetic field sensing element 20 is a magnetoresistance element, for example, a giant magnetoresistance (GMR) element. In another particular embodiment, the first and second magnetic field sensing elements 30, 20, respectively, are both Hall effect elements, the first substrate is comprised of Silicon and the second substrate 26 is comprised of GaAs. In some embodiments, the second magnetic field sensing element 20 is not present.

In some embodiments, the integrated circuit 10 can also include one or more of a first or a second flux concentrator 32, 22, respectively each disposed proximate to an associated one of the first and second magnetic field sensing elements 30, 20, respectively. It will be understood that some materials, for example, ferrite, Permalloy, or other soft magnetic materials, tend to concentrate flux, and their proximity can result in an increased magnetic field. Therefore, the flux concentrators 32, 22 can provide an increased magnetic field proximate to the first and second magnetic field sensing elements 30, 20, respectively, resulting in an increased sensitivity of the first and second magnetic field sensing elements 30, 20 to a magnetic field, for example, a magnetic field resulting from a current in a conductor.

In some embodiments, the integrated circuit 10 also includes one or more of a first resistor 28 formed on the second substrate 26 or a second resistor 24 formed on the first substrate 14. The first and second resistors 28, 24, respectively, can be used by the integrated circuit 10 to measure resistivity changes in the first and second substrates 14, 26, respectively, for example, over time or over temperature. One of ordinary skill in the art will understand how to construct circuits in conjunction with one or more of the resistors 24, 28, to accomplish this end. In some arrangements, one of the first and second resistors 28, 24 is not present, and the remaining one of the first and second resistors 28, 24 is used to detect a resistivity change in one of the first and second substrates 14, 26, respectively.

The integrated circuit can also include a plurality of bonding pads, of which bonding pads 16a-16c are representative. Bond wires 40a-40c can couple the first and/or second substrates 14, 26, respectively, to leads (not shown) of the lead frame 12.

With an arrangement as shown, it will be recognized that packaging materials (not shown), e.g., plastic, that can be used to encase the first and second substrates 14, 26, respectively, would tend to result in stresses and strains upon the second substrate 26. The resulting stresses and strains would tend to affect the sensitivity and linearity of the magnetic field sensing element 30, which is coupled to the second substrate 26. The flip-chip arrangement tends to keep the magnetic field sensing element 30 from direct contact with the packaging material, therefore reducing the stresses and strains. To further reduce the stresses and strains, in some embodiments, the integrated circuit 10 can include an underfill material 42 disposed between the first surface 14a of the first substrate 14 and the first surface 26a of the second substrate 26. The underfill material tends to keep the packaging material, e.g., plastic, from contact with the magnetic field sensing element 30, resulting in a further reduction of stresses and strains upon the magnetic field sensing element 30 and upon the second substrate 26.

The underfill material 42 can be comprised of a, for example Staychip™ NUF-31071 E underfill material (Cookson Electronics Equipment, New Jersey).

It should be appreciated that various insulating layers (not shown) can be used to electrically isolate portions of the integrated circuit 10 from other portions of the integrated circuit 10. For example, an insulating layer (not shown) can be disposed between the first surface 14a of the first substrate 14 and the flux concentrator 22. Also, an insulating layer (not shown) can be disposed between the second surface 26b of the second substrate 26 and the flux concentrator 32.

In some embodiments, the flux concentrator 32 is instead disposed proximate to the first surface 26a of the second substrate 26. In other embodiments flux concentrators may be disposed on both the first and second surfaces 26a, 26b, respectively, of the second substrate 26.

For embodiments having the second magnetic field sensing element 20, in some arrangements, the second magnetic field sensing element 20 can have a different sensitivity to magnetic fields (i.e., currents) than the first magnetic field sensing element 30. Therefore, with these arrangements, the integrated circuit 10 can have more than one "range," or an extended range. With these arrangements, the integrated circuit 10 can operate over a greater span of sensed currents, i.e., magnetic field strengths.

In particular, for embodiments in which the second substrate 26 is comprised of GaAs and the first substrate is comprised of Silicon and both magnetic field sensing elements 30, 20 are Hall effect elements, the sensitivity of the magnetic field sensing element 30 is higher than the sensitivity of the second magnetic field sensing element 20. Therefore, an extended range of operation can be obtained while using only Hall effect elements.

Furthermore, for embodiments in which the second substrate 26 is comprised of GaAs and the magnetic field sensing element 30 is a Hall effect element, and in which the first substrate 14 is comprised of Silicon and the second magnetic field sensing element 20 is not present, a higher sensitivity can be achieved than for an arrangement having only a Silicon based Hall effect element. With this arrangement, known cost advantages of having the circuitry 18 disposed on the silicon substrate 14 can be achieved.

While the first substrate 14 is shown to be conventionally mounted to the lead frame 12, i.e., with the first surface 14a of the first substrate 14 facing away from the lead frame 12, in other arrangements, the first substrate 14 can be flipped relative to the substrate 12. In these arrangements, the first surface 14a of the first substrate 14 is proximate to the lead frame 12 and coupled to the lead frame with a selected one of a solder ball, a gold bump, a eutectic or high lead solder bump, a no-lead solder bump, a gold stud bump, a polymeric conductive bump, an anisotropic conductive paste, or a conductive film. In these arrangements, the first surface 26a of the second substrate 26 remains coupled as shown to the first surface 14a of the first substrate 14, wherein the first surfaces 14a, 26a of the substrates 14, 26, respectively are proximate to each other.

Figure 2:
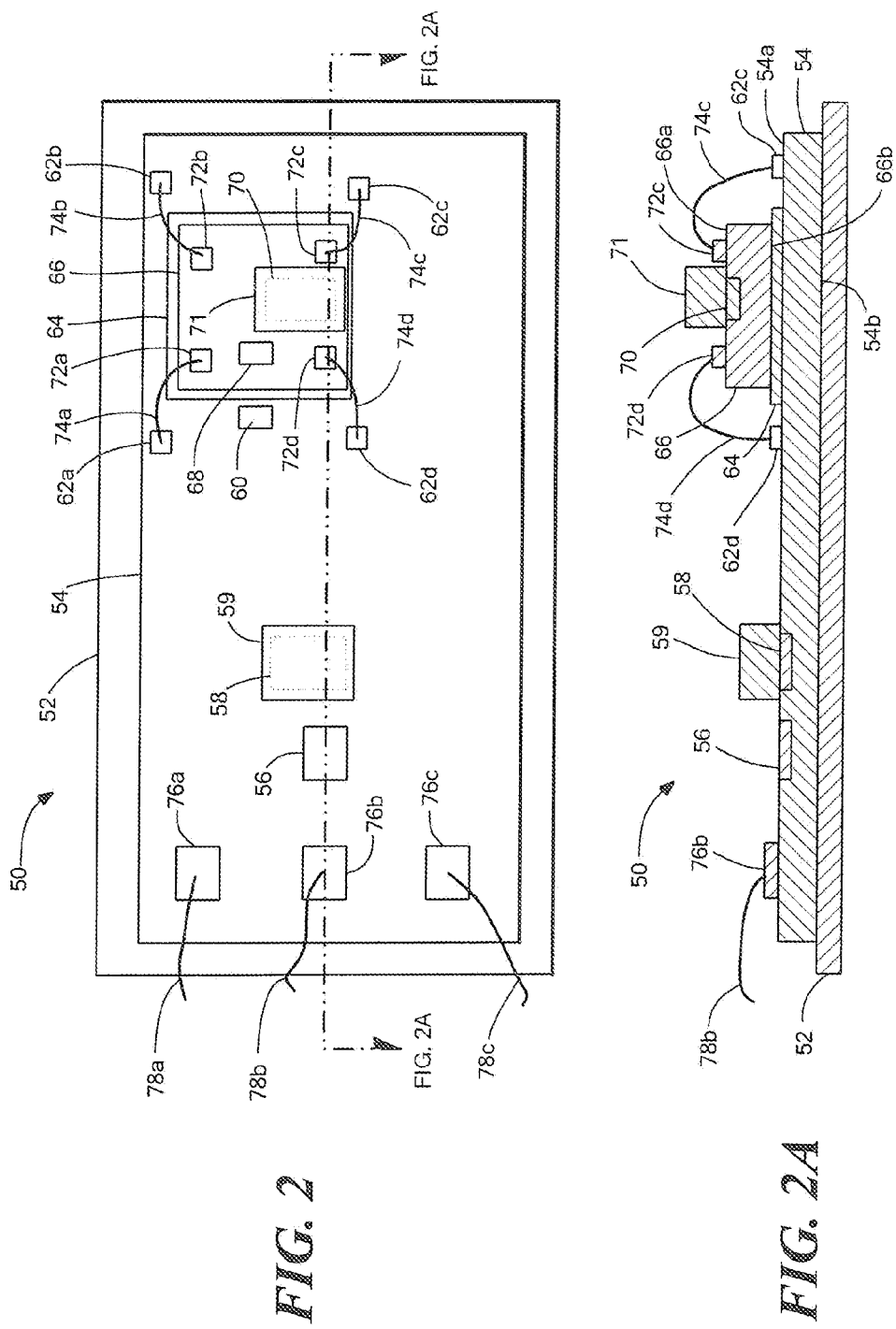
FIG. 2 is a pictorial showing another integrated circuit having first and second substrates.

Referring now to FIGS. 2 and 2A, in which like elements are shown having like reference designators, an integrated circuit 50 includes aspects similar to the integrated circuit 10 of FIGS. 1 and 1A, but without the flip-chip arrangement of FIGS. 1 and 1A.

The integrated circuit 50 includes a lead frame 52. The integrated circuit 50 also includes a first substrate 54 having first and second opposing surfaces 54a, 54b, respectively. The first substrate 54 is coupled to the lead frame 52 such that the second surface 54b of the first substrate 54 is above the lead frame 52 and the first surface 54a of the first substrate 54 is above the second surface 54b of the first substrate 54.

The integrated circuit 50 also includes a second substrate 66 having first and second opposing surfaces 66a, 66b, respectively. The first substrate 54 and the second substrate 66 are coupled such that the second surface 66b of the second substrate 66 is above the first surface 54a of the first substrate 54 and the first surface 66a of the second substrate 66 is above the second surface 66b of the second substrate 66.

The first and second substrates 54, 66, respectively can be comprised of a variety of materials including, but not limited to, Si, GaAs, InP, InSb, InGaAs, InGaAsP, SiGe, ceramic, or glass. The first and second substrates 54, 66, respectively, can be comprised of the same material or of different materials. In one particular embodiment, the first substrate 54 is comprised of Silicon (Si) and the second substrate 66 is comprised of Gallium Arsenide (GaAs).

The first surface 66a of the second substrate 66 can be coupled to the first surface 54a of the first substrate 54 with wire bonds 74a-74d. Four such couplings 74a-74d are shown. However, it will be appreciated that the integrated circuit 50 can have more than four or fewer than four such couplings.

The integrated circuit 50 also includes at least one electronic component 56 disposed on the first surface 54a of the first substrate 54. The electronic component 56 can include, but is not limited to, a passive electronic component, for example, a resistor, capacitor, or inductor, and an active electronic component, for example, a transistor, an amplifier, or another integrated circuit.

The integrated circuit 50 also includes a first magnetic field sensing element 70 disposed on the first surface 66a of the second substrate 66.

In some embodiments, the integrated circuit 50 further includes a second magnetic field sensing element 58 disposed on the first surface 54a of the first substrate 54. The first and second magnetic field sensing elements 70, 58, respectively, can be selected ones of a Hall effect element and a magnetoresistance element as described above. In some embodiments, the first and second magnetic field sensing elements 70, 58, respectively, are the same type of magnetic field sensing element, and in other embodiments, the first and second magnetic field sensing elements 70, 58, respectively, are different types of magnetic field sensing elements.

In one particular embodiment, the first magnetic field sensing element 70 is a Hall effect element and the second magnetic field sensing element 58 is a magnetoresistance element, for example, a giant magnetoresistance (GMR) element. In another particular embodiment, the first and second magnetic field sensing elements 70, 58, respectively, are both Hall effect elements, the first substrate 54 is comprised of Silicon and the second substrate 66 is comprised of GaAs. In some embodiments, the second magnetic field sensing element 58 is not present.

In some embodiments, the integrated circuit 50 can also include one or more of a first or a second flux concentrator 71, 59, respectively, each disposed proximate to an associated one of the first and second magnetic field sensing elements 70, 58, respectively. The flux concentrators 71, 59 can provide an increased magnetic field proximate to the first and second magnetic field sensing elements 70, 58 and a corresponding increased sensitivity of the first and second magnetic field sensing elements 70, 58 to a magnetic field, for example, a magnetic field resulting from a current in a conductor.

In some embodiments, the integrated circuit 50 also includes one or more of a first resistor 68 formed on the second substrate 66 or a second resistor 60 formed on the first substrate 54. The first and second resistors 68, 60, respectively, can be used by the integrated circuit 50 to measure resistivity changes in the first and second substrates 54, 66, respectively, for example, over time or over temperature. As described above in conjunction with FIGS. 1 and 1A, one of ordinary skill in the art will understand how to construct circuits in conjunction with one or more of the resistors 68, 60, to accomplish this end. In some arrangements, one of the first and second resistors 68, 60 is not present, and the remaining one of the first and second resistors 68, 60 is used to detect a resistivity change in one of the first and second substrates 54, 66, respectively.

The integrated circuit 50 can also include a plurality of bonding pads, of which bonding pads 76a-76c are representative. Bond wires 78a-78c can couple the first and/or second substrates 54, 66, respectively, to leads (not shown) of the lead frame 52.

It should be appreciated that various insulating layers can be used to electrically isolate portions of the integrated circuit 50 from other portions of the integrated circuit 50. For example, an insulating layer 64 can be disposed between the first surface 14a of the first substrate 14 and the second surface 66b of the second substrate 66.

For embodiments having the second magnetic field sensing element 58, in some arrangements, the second magnetic field sensing element 58 can have a different sensitivity to magnetic fields (i.e., currents) than the first magnetic field sensing element 70. Therefore, with these arrangements, the integrated circuit 10 can have more than one "range," or an extended range. With these arrangements, the integrated circuit 50 can operate over a greater span of sensed currents, i.e., magnetic field strengths.

Exemplary combinations of types of magnetic field sensing elements and substrate materials are further described above in conjunction with FIGS. 1 and 1A. At least the same combinations apply to the integrated circuit 50.

Figure 3:
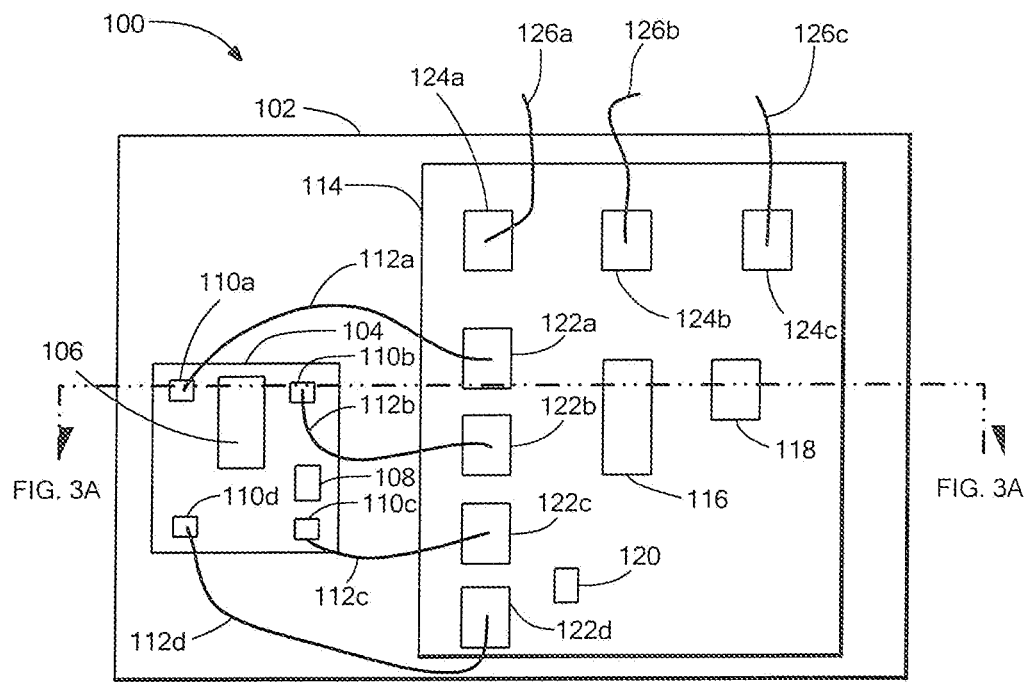
FIG. 3 is a pictorial showing another integrated circuit having first and second substrates.
Figure 3A:
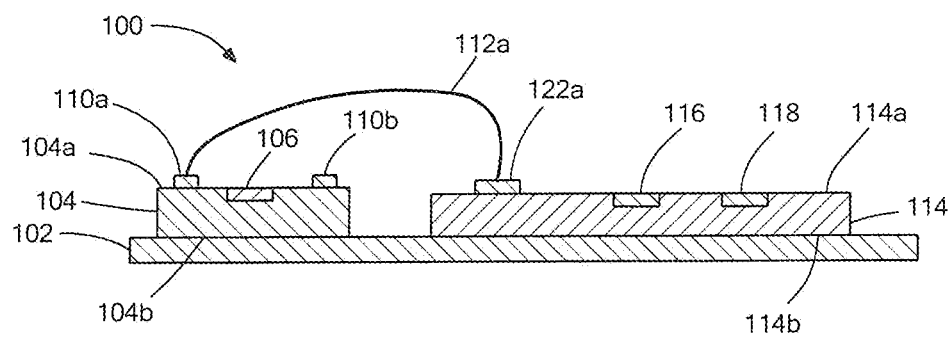
FIG. 3A is a cross-sectional view of the integrated circuit of FIG. 3.

Referring now to FIGS. 3 and 3A, in which like elements are shown having like reference designators, an integrated circuit 100 includes aspects similar to the integrated circuit 10 of FIGS. 1 and 1A.

The integrated circuit 100 includes a lead frame 102. The integrated circuit 100 also includes a first substrate 114 having first and second opposing surfaces 114a, 114b, respectively. The integrated circuit 100 also includes a second substrate 104 having first and second opposing surfaces 104a, 104b, respectively.

The first substrate 114 is coupled to the lead frame 102 such that the second surface 114b of the first substrate 114 is above the lead frame 102 and the first surface 114a of the first substrate 114 is above the second surface 114b of the first substrate 114. The second substrate 104 is coupled to the lead frame 102 such that the second surface 104b of the second substrate 104 is above the lead frame 102 and the first surface 104a of the second substrate 104 is above the second surface 104b of the second substrate 104.

The first and second substrates 114, 104, respectively can be comprised of a variety of materials including, but not limited to, Si, GaAs, InP, InSb, InGaAs, InGaAsP, SiGe, ceramic, or glass. The first and second substrates 114, 104, respectively, can be comprised of the same material or of different materials. In one particular embodiment, the first substrate 114 is comprised of Silicon (Si) and the second substrate 104 is comprised of Gallium Arsenide (GaAs).

The first surface 104a of the second substrate 104 can be coupled to the first surface 114a of the first substrate 114 with wire bonds 112a-112d. Four such couplings 112a-112d are shown. However, it will be appreciated that the integrated circuit 100 can have more than four or fewer than four such couplings.

The integrated circuit 100 also includes at least one electronic component 118 disposed on the first surface 114a of the first substrate 114. The electronic component 118 can include, but is not limited to, a passive electronic component, for example, a resistor, capacitor, or inductor, and an active electronic component, for example, a transistor, an amplifier, or another integrated circuit.

The integrated circuit 100 also includes a first magnetic field sensing element 106 disposed on the first surface 104a of the second substrate 104.

In some embodiments, the integrated circuit 100 further includes a second magnetic field sensing element 116 disposed on the first surface 114a of the first substrate 114. The first and second magnetic field sensing elements 106, 116, respectively, can be selected ones of a Hall effect element and a magnetoresistance element as described above. In some embodiments, the first and second magnetic field sensing elements 106, 116, respectively, are the same type of magnetic field sensing element, and in other embodiments, the first and second magnetic field sensing elements 106, 116, respectively, are different types of magnetic field sensing elements.

In one particular embodiment, the first magnetic field sensing element 106 is a Hall effect element and the second magnetic field sensing element 116 is a magnetoresistance element, for example, a giant magnetoresistance (GMR) element. In another particular embodiment, the first and second magnetic field sensing elements 106, 116, respectively, are both Hall effect elements, the first substrate 114 is comprised of Silicon and the second substrate 104 is comprised of GaAs. In some embodiments, the second magnetic field sensing element 116 is not present.

In some embodiments, the integrated circuit 100 can also include one or more of a first or a second flux concentrator (not shown) each disposed proximate to an associated one of the first and second magnetic field sensing elements 106, 116, respectively. The flux concentrators (not shown) can provide an increased magnetic field proximate to the first and second magnetic field sensing elements 106, 116 and a corresponding increased sensitivity of the first and second magnetic field sensing elements 106, 116 to a magnetic field, for example, a magnetic field resulting from a current in a conductor.

In some embodiments, the integrated circuit 100 also includes one or more of a first resistor 108 formed on the second substrate 104 or a second resistor 120 formed on the first substrate 114. The first and second resistors 108, 120, respectively, can be used by the integrated circuit 100 to measure resistivity changes in the first and second substrates 114, 104, respectively, for example, over time or over temperature. As described above in conjunction with FIG. 1, one of ordinary skill in the art will understand how to construct circuits in conjunction with one or more of the resistors 108, 120, to accomplish this end. In some arrangements, one of the first and second resistors 108, 120 is not present, and the remaining one of the first and second resistors 108, 120 is used to detect a resistivity change in one of the first and second substrates 114, 104, respectively.

The integrated circuit 100 can also include a plurality of bonding pads, of which bonding pads 124a-124c are representative. Bond wires 126a-126c can couple the first substrates 114 to leads (not shown) of the lead frame 102.

It should be appreciated that various insulating layers can be used to electrically isolate portions of the integrated circuit 100 from other portions of the integrated circuit 100. For example, insulating layers (not shown) can be disposed between the second surface 114b of the first substrate 114 and the lead frame 102 and also between the second surface 104b of the first substrate 104 and the lead frame 102.

For embodiments having the second magnetic field sensing element 116, in some arrangements, the second magnetic field sensing element 116 can have a different sensitivity to magnetic fields (i.e., currents) than the first magnetic field sensing element 106. Therefore, with these arrangements, the integrated circuit 100 can have more than one "range," or an extended range. With these arrangements, the integrated circuit 100 can operate over a greater span of sensed currents, i.e., magnetic field strengths.

Exemplary combinations of types of magnetic field sensing elements and substrate materials are further described above in conjunction with FIGS. 1 and 1A. At least the same combinations apply to the integrated circuit 100.

Figure 4:
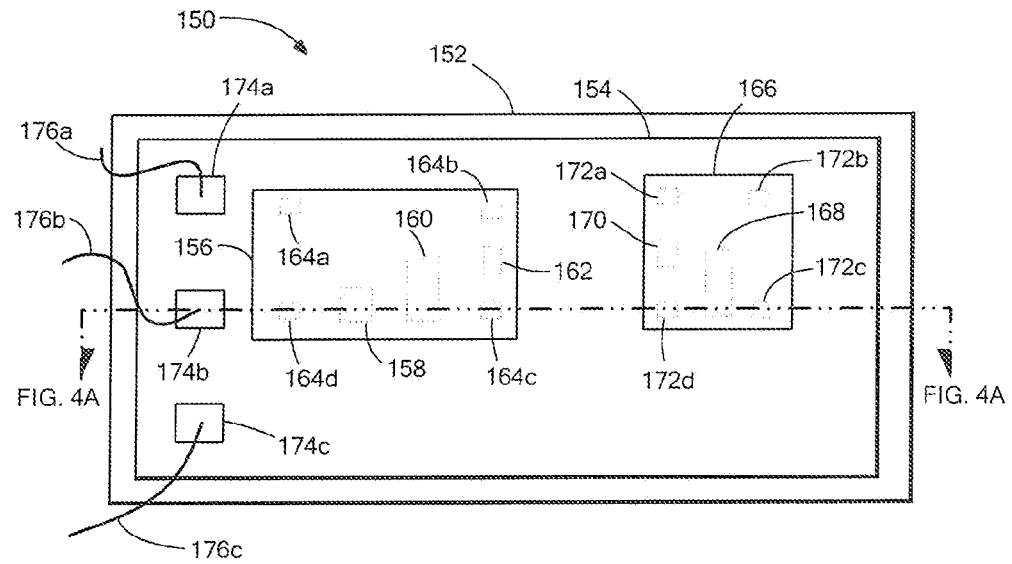
FIG. 4 is a pictorial showing an integrated circuit having first and second substrates and a base substrate.
Figure 4A:
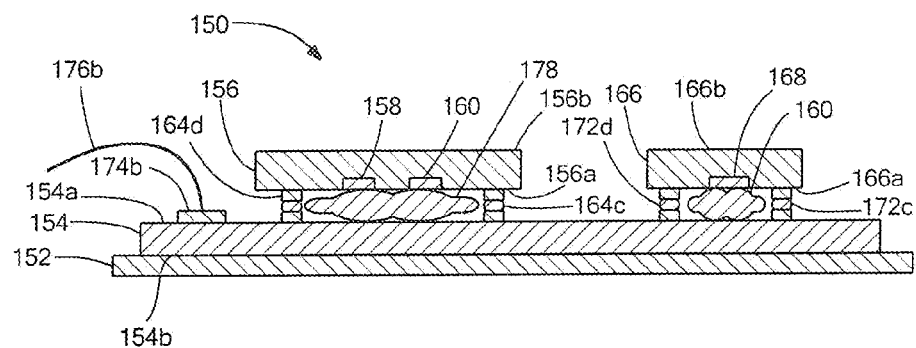
FIG. 4A is a cross-sectional view of the integrated circuit of FIG. 4.

Referring now to FIGS. 4 and 4A, in which like elements are shown having like reference designators, an integrated circuit 150 includes aspects similar to the integrated circuit 10 of FIGS. 1 and 1A, including a flip-chip arrangement as shown in FIGS. 1 and 1A.

The integrated circuit 150 includes a lead frame 152 and a base substrate 154 having first and second opposing surfaces 154a, 154b, respectively. The base substrate can be comprised of a variety of materials, for example, ceramic, glass, polymer, i.e. FR-4, or a semiconductor. The integrated circuit 150 also includes a first substrate 156 having first and second opposing surfaces 156a, 156b, respectively, and a second substrate 166 having first and second opposing surfaces 166a, 166b, respectively.

The base substrate 154 is coupled to the lead frame 152 such that the second surface 154b of the base substrate 154 is above the lead frame 152 and the first surface 154a of the base substrate 154 is above the second surface 154b of the base substrate 154. The first substrate 156 is coupled to the base substrate 154 such that the first surface 156a of the first substrate 156 is above the first surface 154a of the base substrate 154 and the second surface 156b of the first substrate 156 is above the first surface 156a of the first substrate 156. The second substrate 166 is coupled to the base substrate 154 such that the first surface 166a of the second substrate 166 is above the first surface 154a of the base substrate 154 and the second surface 166b of the second substrate 166 is above the first surface 166a of the second substrate 166.

The first and second substrates 156, 166, respectively can be comprised of a variety of materials including, but not limited to, Si, GaAs, InP, InSb, InGaAs, InGaAsP, SiGe, ceramic, or glass. The first and second substrates 156, 166, respectively, can be comprised of the same material or of different materials. In one particular embodiment, the first substrate 156 is comprised of Silicon (Si) and the second substrate 166 is comprised of Gallium Arsenide (GaAs).

The first surface 166a of the second substrate 166 can be coupled to the first surface 154a of the base substrate 154 with a conductive element, for example, a solder ball, a gold bump, a eutectic or high lead solder bump, a no-lead solder bump, a gold stud bump, a polymeric conductive bump, an anisotropic conductive paste, or a conductive film. Four such couplings 172a-172c are shown. However, it will be appreciated that the integrated circuit 150 can have more than four or fewer than four such couplings.

The first surface 156a of the second substrate 156 can also be coupled to the first surface 154a of the base substrate 154 with a selected one of a solder ball, a gold bump, a eutectic or high lead solder bump, a no-lead solder bump, a gold stud bump, a polymeric conductive bump, an anisotropic conductive paste, or a conductive film. Four such couplings 164a-164c are shown. However, it will be appreciated that the integrated circuit 150 can have more than four or fewer than four such couplings.

With this arrangement, the base substrate 154 can have conductive traces or the like (not shown) to couple the first substrate 156 to the second substrate 166, and to the pads 174a-c.

The integrated circuit 150 also includes at least one electronic component 158 disposed on the first surface 156a of the first substrate 156. The electronic component 158 can include, but is not limited to, a passive electronic component, for example, a resistor, capacitor, or inductor, and an active electronic component, for example, a transistor, an amplifier, or another integrated circuit.

The integrated circuit 150 also includes a first magnetic field sensing element 168 disposed on the first surface 166a of the second substrate 166.

In some embodiments, the integrated circuit 150 further includes a second magnetic field sensing element 160 disposed on the first surface 156a of the first substrate 156. The first and second magnetic field, sensing elements 168, 160, respectively, can be selected ones of a Hall effect element and a magnetoresistance element as described above. In some embodiments, the first and second magnetic field sensing elements 168, 160, respectively, are the same type of magnetic field sensing element, and in other embodiments, the first and second magnetic field sensing elements 168, 160, respectively, are different types of magnetic field sensing elements.

In one particular embodiment, the first magnetic field sensing element 168 is a Hall effect element and the second magnetic field sensing element 160 is a magnetoresistance element, for example, a giant magnetoresistance (GMR) element. In another particular embodiment, the first and second magnetic field sensing elements 168, 160, respectively, are both Hall effect elements, the first substrate 156 is comprised of Silicon and the second substrate 166 is comprised of GaAs. In some embodiments, the second magnetic field sensing element 160 is not present.

In some embodiments, the integrated circuit 150 can also include one or more of a first or a second flux concentrator (not shown) each disposed proximate to an associated one of the first and second magnetic field sensing elements 168, 160, respectively. The flux concentrators (not shown) can provide an increased magnetic field proximate to the first and second magnetic field sensing elements 168, 160 and a corresponding increased sensitivity of the first and second magnetic field sensing elements 168, 160 to a magnetic field, for example, a magnetic field resulting from a current in a conductor.

In some embodiments, the integrated circuit 150 also includes one or more of a first resistor 170 formed on the second substrate 166 or a second resistor 162 formed on the first substrate 156. The first and second resistors 170, 162, respectively, can be used by the integrated circuit 150 to measure resistivity changes in the first and second substrates 156, 166, respectively, for example, over time or over temperature. As described above in conjunction with FIGS. 1 and 1A, one of ordinary skill in the art will understand how to construct circuits in conjunction with one or more of the resistors 170, 162, to accomplish this end. In some arrangements, one of the first and second resistors 170, 162 is not present, and the remaining one of the first and second resistors 170, 162 is used to detect a resistivity change in one of the first and second substrates 156, 166, respectively.

The integrated circuit 150 can also include a plurality of bonding pads, of which bonding pads 174a-174c are representative. Bond wires 176a-176c can couple the first and/or second substrates 156, 166, respectively, to leads (not shown) of the lead frame 152.

It should be appreciated that various insulating layers (not shown) can be used to electrically isolate portions of the integrated circuit 150 from other portions of the integrated circuit 150.

For embodiments having the second magnetic field sensing element 160, in some arrangements, the second magnetic field sensing element 160 can have a different sensitivity to magnetic fields (i.e., currents) than the first magnetic field sensing element 168. Therefore, with these arrangements, the integrated circuit 150 can have more than one "range," or an extended range. With these arrangements, the integrated circuit 150 can operate over a greater span of sensed currents, i.e., magnetic field strengths.

Exemplary combinations of types of magnetic field sensing elements and substrate materials are further described above in conjunction with FIGS. 1 and 1A. At least the same combinations apply to the integrated circuit 150.

While only the first and second substrates 156, 166, respectively, are shown to be coupled to the base substrate 154, it will be appreciated that in other arrangements there can be more than two or fewer than two substrates coupled to the base substrate 154.

Figure 5:
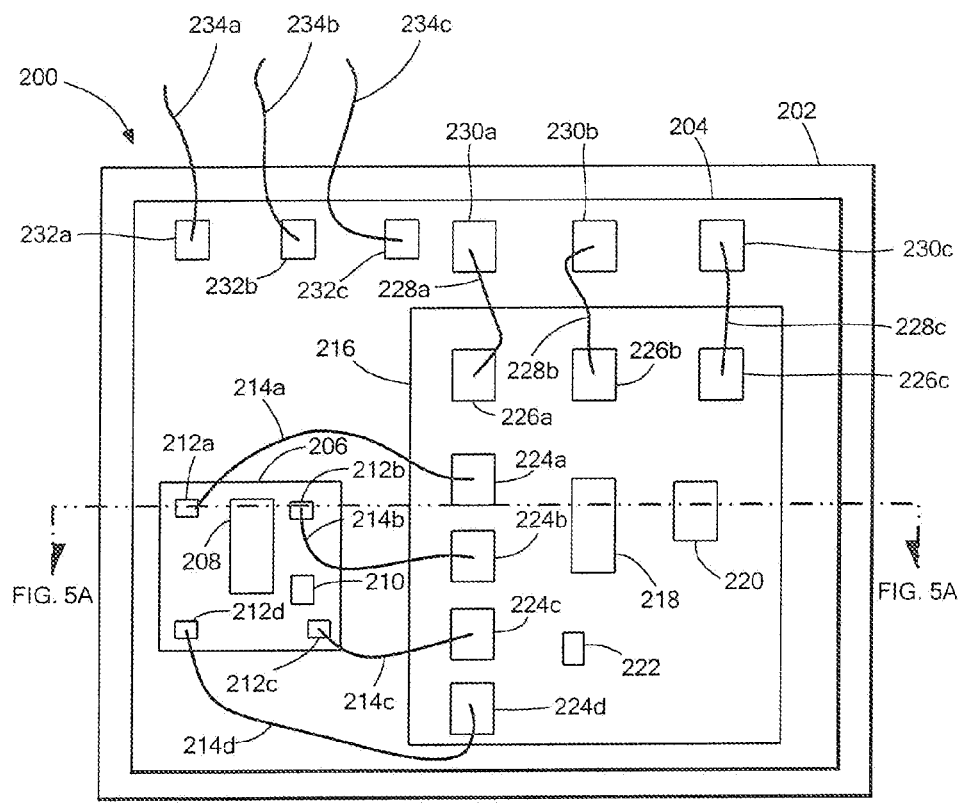
FIG. 5 is a pictorial showing another integrated circuit having first and second substrates and a base substrate.
Figure 5A:
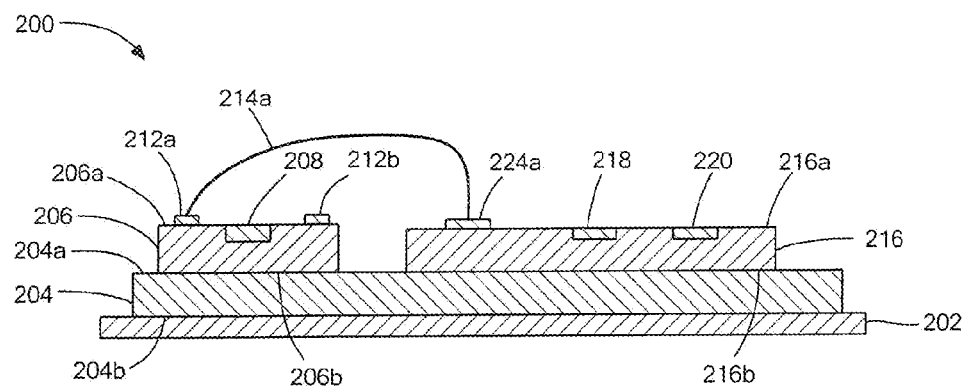
FIG. 5A is a cross-sectional view of the integrated circuit of FIG. 5.

Referring now to FIGS. 5 and 5A, in which like elements are shown having like reference designators, an integrated circuit 200 includes aspects similar to the integrated circuit 10 of FIGS. 1 and 1A.

The integrated circuit 200 includes a lead frame 202 and a base substrate 204 having first and second opposing surfaces 204a, 204b, respectively. The base substrate can be comprised of a variety of materials, for example, ceramic, glass, polymer, i.e. FR-4, or a semiconductor. The integrated circuit 200 also includes a first substrate 216 having first and second opposing surfaces 216a, 216b, respectively, and a second substrate 206 having first and second opposing surfaces 206a, 206b, respectively.

The base substrate 204 is coupled to the lead frame 202 such that the second surface 204b of the base substrate 204 is above the lead frame 202 and the first surface 204a of the base substrate 204 is above the second surface 204b of the base substrate 204. The first substrate 216 is coupled to the base substrate 204 such that the second surface 216b of the first substrate 216 is above the first surface 204a of the base substrate 204 and the first surface 216a of the first substrate 216 is above the second surface 216b of the first substrate 216. The second substrate 206 is coupled to the base substrate 204 such that the second surface 206b of the second substrate 206 is above the first surface 204a of the base substrate 204 and the first surface 206a of the second substrate 206 is above the second surface 206b of the second substrate 206.

The first and second substrates 216, 206, respectively can be comprised of a variety of materials including, but not limited to, Si, GaAs, InP, InSb, InGaAs, InGaAsP, SiGe, ceramic, or glass. The first and second substrates 216, 206, respectively, can be comprised of the same material or of different materials. In one particular embodiment, the first substrate 216 is comprised of Silicon (Si) and the second substrate 206 is comprised of Gallium Arsenide (GaAs).

The first surface 206a of the second substrate 206 can be coupled to the first surface 216a of the first substrate 216 with wire bonds 214a-214d. Four such couplings 214a-214d are shown. However, it will be appreciated that the integrated circuit 200 can have more than four or fewer than four such couplings.

The integrated circuit 200 also includes at least one electronic component 220 disposed on the first surface 216a of the first substrate 216. The electronic component 220 can include, but is not limited to, a passive electronic component, for example, a resistor, capacitor, or inductor, and an active electronic component, for example, a transistor, an amplifier, or another integrated circuit.

The integrated circuit 200 also includes a first magnetic field sensing element 208 disposed on the first surface 206a of the second substrate 206.

In some embodiments, the integrated circuit 200 further includes a second magnetic field sensing element 218 disposed on the first surface 216a of the first substrate 216. The first and second magnetic field sensing elements 208, 218, respectively, can be selected ones of a Hall effect element and a magnetoresistance element as described above. In some embodiments, the first and second magnetic field sensing elements 208, 218, respectively, are the same type of magnetic field sensing element, and in other embodiments, the first and second magnetic field sensing elements 208, 218, respectively, are different types of magnetic field sensing elements.

In one particular embodiment, the first magnetic field sensing element 208 is a Hall effect element and the second magnetic field sensing element 218 is a magnetoresistance element, for example, a giant magnetoresistance (GMR) element. In another particular embodiment, the first and second magnetic field sensing elements 208, 218, respectively, are both Hall effect elements, the first substrate 216 is comprised of Silicon and the second substrate 206 is comprised of GaAs. In some embodiments, the second magnetic field sensing element 218 is not present.

In some embodiments, the integrated circuit 200 can also include one or more of a first or a second flux concentrator (not shown) each disposed proximate to an associated one of the first and second magnetic field sensing elements 208, 218, respectively. The flux concentrators (not shown) can provide an increased magnetic field proximate to the first and second magnetic field sensing elements 208, 218 and a corresponding increased sensitivity of the first and second magnetic field sensing elements 208, 218 to a magnetic field, for example, a magnetic field resulting from a current in a conductor.

In some embodiments, the integrated circuit 200 also includes one or more of a first resistor 210 formed on the second substrate 206 or a second resistor 222 formed on the first substrate 216. The first and second resistors 210, 222, respectively, can be used by the integrated circuit 200 to measure resistivity changes in the first and second substrates 216, 206, respectively, for example, over time or over temperature. As described above in conjunction with FIGS. 1 and 1A, one of ordinary skill in the art will understand how to construct circuits in conjunction with one or more of the resistors 210, 222, to accomplish this end. In some arrangements, one of the first and second resistors 210, 222 is not present, and the remaining one of the first and second resistors 210, 222 is used to detect a resistivity change in one of the first and second substrates 216, 206, respectively.

The integrated circuit 200 can also include a plurality of bonding pads, of which bonding pads 232a-232c are representative. Bond wires 234a-234c can couple the first and/or second substrates 216, 206, respectively, to leads (not shown) of the lead frame 202.

It should be appreciated that various insulating layers (not shown) can be used to electrically isolate portions of the integrated circuit 200 from other portions of the integrated circuit 200.

For embodiments having the second magnetic field sensing element 218, in some arrangements, the second magnetic field sensing element 218 can have a different sensitivity to magnetic fields (i.e., currents) than the first magnetic field sensing element 208. Therefore, with these arrangements, the integrated circuit 200 can have more than one "range," or an extended range. With these arrangements, the integrated circuit 200 can operate over a greater span of sensed currents, i.e., magnetic field strengths.

Exemplary combinations of types of magnetic field sensing elements and substrate materials are farther described above in conjunction with FIGS. 1 and 1A. At least the same combinations apply to the integrated circuit 200.

Figure 6:
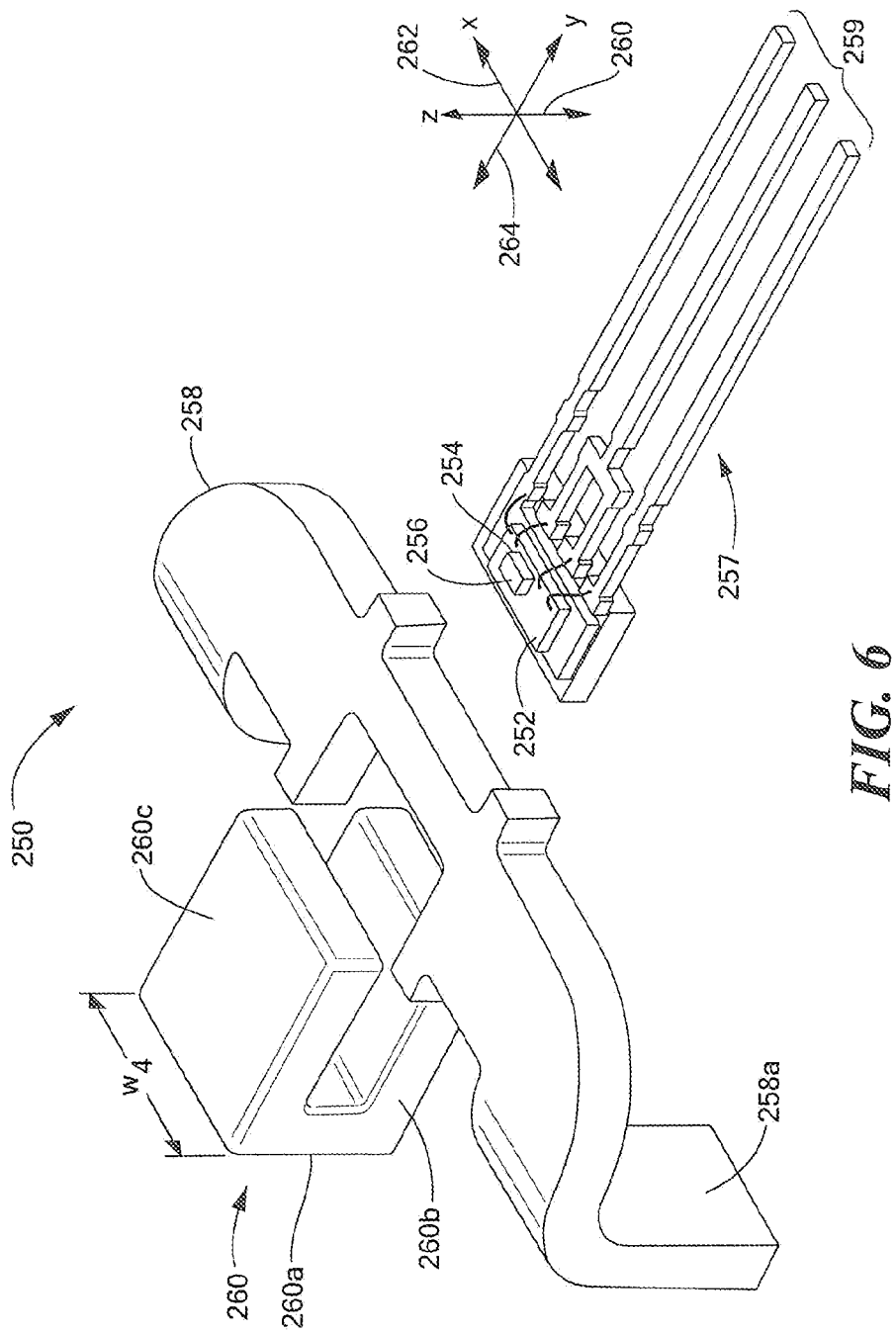
FIG. 6 is an exploded view showing an exemplary integrated current sensor having first and second substrates and having an integrated current-carrying conductor.

Referring now to FIG. 6, an integrated circuit 250, shown in an exploded view, includes a first substrate 252, a second substrate 254, and a lead frame 257. The first substrate 252, second substrate 254, and the lead frame 257 can be the same as or similar to similar elements of any of the integrated circuit 10, 50, 100, 150, and 200 of FIGS. 1-1A, 2-2A, 3-3A, 4-4A, and 5-5A, respectively.

The second substrate 254 includes a magnetic field sensing element 256, which can be a selected one of a Hall effect element or a magnetoresistance element. It will be appreciated that a position of the magnetic field sensing element 256 can be selected in accordance with an axis of sensitivity of the magnetic field sensing element 256 relative to a magnetic field that is being sensed. The integrated circuit 250 also includes a current-carrying conductor 258 and a magnetic core 260 (also referred to herein as a flux concentrator). The magnetic core 260 is substantially C-shaped and has a central region 260a and a pair of substantially parallel legs 260b, 260c extending from the central region 260a. When assembled, the flux concentrator 260 is shaped so that the leg 260b is disposed under the lead frame 257 and the other leg 260c is disposed above the second substrate 254.

The lead frame 275 has leads 259 adapted for mounting to a printed circuit board (not shown). The leads 259, can include, for example, a power, or Vcc, connection, a ground connection, and an output connection adapted to carry an output signal proportional to the current through the conductor 258. The output signal may be a current or a voltage.

The first substrate 252 includes circuitry (not shown) for processing the output signal of the Hall effect element 256

The conductor 258 can be comprised of various conductive materials, such as copper, and is adapted for mounting to a printed circuit board through which the measured current is provided to the conductor 258. To this end, bent leads or tabs 258a, 258b (258b not shown) suitable for soldering into circuit board vias are provided at end portions of the conductor 258. Mechanisms other than bent tabs 258a, 258b may be used to mount the integrated circuit 250 to a circuit board, such as screw terminals and associated. In alternate embodiments, the same or other mounting mechanisms can be used to allow the integrated circuit 250 to be mounted to other than a circuit board. For example, the integrated circuit 250 can have wire couplings (not shown) that allow the integrated circuit 250 to be coupled in series with a wire.

The conductor 258 (excluding the bent tabs 258a, 258b) can be substantially planar as shown, without features extending in a z-axis 266 which would tend to increase the height of the integrated circuit 250 off of a printed circuit board. In use, the plane of the conductor 258 is positioned close to the printed circuit board plane, thereby providing a low profile integrated circuit.

The flux concentrator 260 tends to tailor the magnetic field across the Hall effect element 256. The flux concentrator 260 may be comprised of various materials including, but not limited to ferrite, steel, iron compounds, Permalloy, or other soft magnetic materials. The material of the flux concentrator 260 is selected, based on factors such as maximum measured current and the desired amount of magnetic shielding provided by the flux concentrator 260. Other factors include stability of the relative permeability over temperature and hysteresis (magnetic remaneuce). For example, a low hysteresis ensures greater accuracy for small currents through the conductor 258. The material and size of the flux concentrator 260 are also selected in accordance with the desired full scale current through the conductor 258, wherein a magnetic core material with a higher saturation flux density (Bsat) allows the use of a smaller core for a given current flowing through the conductor 258. It will be appreciated that use of the flux concentrator 260 significantly reduces the susceptibility of the integrated circuit to stray magnetic fields.

Referring now to FIGS. 7 and 7A, in which like elements are shown having like reference designations, an integrated circuit 300 includes a lead frame 302 having a plurality of leads 302a-302h, a first substrate 306, and a second substrate 307.

The leads 302a and 302b are coupled to the leads 302c and 302d to form a current path, or current conductor with a narrow portion 304 having a width w1. The first substrate 306 has a first surface 306a and a second, opposing surface 306b and the second substrate 307 has a first surface 307a and a second, opposing surface 307b. The first substrate 306 can have a magnetic field sensing element 308, which, in some embodiments, can be a Hall effect element 308, diffused into the first surface 306a, or otherwise disposed on the first surface 306a of the first substrate 306. Similarly, the second substrate 307 can have a magnetic field sensing element 309, which, in some embodiments, can be a Hall effect element 309, diffused into the first surface 307a, or otherwise disposed on the first surface 307a of the second substrate 307.

The first and second substrates 306, 307, respectively, are shown to be coupled together in a flip-chip arrangement similar to the integrated circuit 10 of FIG. 1. As described above in conjunction with FIGS. 1 and 1A, the first substrate 14 of FIGS. 1 and 1A can be mounted in a flip-chip arrangement to the substrate 12, which arrangement is shown in FIG. 7. However, in other embodiments, it should be recognized that an integrated circuit similar to the integrated circuit 300 can be formed from any of the arrangements of FIGS. 2-2A, 3-3A, 4-4A, and 5-5A.

The substrate 306 is disposed above the lead frame 302 so that the first surface 306a is proximate to the current conductor portion 304 and the second surface 306b is distal from the current conductor portion 304 and more specifically, so that the Hall effect element 308 is in close proximity to the current conductor portion 304. Similarly, the magnetic field sensing element 309 of the second substrate 307 is in close proximity to the current conductor portion 304. In the illustrated embodiment, the substrate 306 has an orientation that is upside down (i.e., the first surface 306a is directed downward) relative to a conventional orientation with which a substrate is mounted in an integrated circuit package.

The first substrate 306 has bonding pads 310a-310c on the first surface 306a, to which bond wires 312a-312c are coupled. The bond wires are further coupled to the leads 302e, 302f, 302h of the lead frame 302.

An insulator 314 separates and electrically isolates the substrate 306 from the lead frame 302. The insulator 314 can be provided in a variety of ways. For example, in one embodiment, a first portion of the insulator 314 includes a four μm thick layer of a BCB resin material deposited directly on the first surface 306a of the substrate 306. A second portion of the insulator 314 includes a layer of Staychip™ NUF-31071 E underfill material (Cookson Electronics Equipment, New Jersey) deposited on the lead frame 302. Such an arrangement provides more than one thousand volts of isolation between the substrate 306 and the lead frame 302.

It will be understood that the current conductor portion 304 is but a part of the total path through which an electrical current flows. For example, a current having a direction depicted by arrows 316 flows into the leads 302c, 302d, which are here shown to be electrically coupled in parallel, through the current conductor portion 304, and out of the leads 302a, 302b, which are also shown here to be electrically coupled in parallel.

With this arrangement, the Hall effect elements 308, 309 are disposed in close proximity to the current conductor portion 304 and at a predetermined position relative to the current conductor portion 304, such that a magnetic field generated by an electrical current passing though the current conductor portion 304, in a direction shown by arrows 316, is in a direction substantially aligned with a maximum response axis of the Hall effect elements 308, 309. The Hall effect elements 308, 309 generate respective voltage outputs proportional to the magnetic field and therefore proportional to the current flowing through the current conductor portion 304. The illustrated Hall effect elements 308, 309 have a maximum response axis substantially aligned with a z-axis 324. Because the magnetic field generated in response to the current is circular about the current conductor portion 304, the Hall effect elements 308, 309 are disposed just to the side (i.e., slightly offset along a y-axis 322) of the current conductor portion 304, as shown, where the magnetic field is pointed substantially along the z-axis 324. This position results in a greater voltage output from the Hall effect elements 308, 309 and therefore, improved sensitivity. However, a vertical Hall effect element, or another type of magnetic field sensor, for example a magnetoresistance element, having a maximum response axis aligned in another direction, can be disposed at another position relative to the current conductor portion 304, for example, on top of the current conductor portion 304 (in a direction along z-axis 324).

In the embodiment of FIG. 7, the close proximity between the Hall effect elements 308, 309 and the current conductor 304 is achieved by providing the Hall effect element 308 on the first surface 306a of the first substrate 306, and by providing the Hall effect element 309 on the first surface 307a of the second substrate 307.

Referring now to FIGS. 8 and 8A, in which like elements are shown having like reference designations, another exemplary integrated circuit 350 includes a lead frame 352 having a plurality of leads 352a-352h and a current conductor portion 354 provided as a combination of a first current conductor portion 354a and a second current conductor portion 354b. The integrated circuit 350 also includes a substrate 356 having a first surface 356a and a second, opposing, surface 356b. The substrate 356 has a Hall effect element 358 diffused into the first surface 356a, or otherwise disposed on or supported by the first surface 356a. The substrate 356 also has two magnetoresistance elements 360a, 360b disposed on or otherwise supported by the first surface 356a of the substrate 356. The substrate 356 is disposed on the lead frame 352 so that the Hall effect element 358 and the magnetoresistance elements 360a, 360b are in close proximity to the current conductor portion 354.

In the illustrated embodiment, the substrate 356 has an orientation that is upside down (i.e., the first surface 356a is directed downward) in relation to the conventional orientation of a substrate mounted in an integrated circuit package. The substrate 356 is a flip-chip having solder balls 362a-362e on the first surface 356a of the substrate 356. The solder balls 362a-362e couple directly to the leads 352e-352h. An insulator (not shown) can separate and electrically isolate the substrate 356 from the lead frame 352.

In one particular embodiment, the second current conductor portion 354b is deposited on the first surface 356a of the substrate 356, while avoiding, or being otherwise insulated from, the two magnetoresistance elements 360a, 360b. The second current conductor portion 354b can be deposited by any conventional integrated circuit deposition technique, including, but not limited to, sputtering and electroplating, in other embodiments, the second current conductor portion 354b is a conductive structure separate from, but proximate to, the first surface 356a of the substrate 356.

With this arrangement, the Hall effect element 358 and the magnetoresistance elements 360a, 360b are disposed in close proximity to the current conductor portion 354 and at a predetermined position relative to the current conductor portion 354 such that a magnetic field generated by an electrical current passing though the current conductor portion 354 is in a direction substantially aligned with a maximum response axis of the Hall effect element 358 and with the maximum response axes of the magnetoresistance elements 360a, 360b. Here, the Hall effect element 358 has a maximum response axis aligned with a z-axis 363 and the two magnetoresistance elements have maximum response axes substantially aligned with an x-axis 364. Therefore, the Hall effect element 358 is disposed to a side (i.e., slightly offset along a y-axis 324) of the current conductor portion 354, as shown, where the magnetic field is pointed along the z-axis 328. The magnetoresistance elements 360a, 360b, however, are disposed in a z-axis alignment with respect to the current conductor portion 354.

In operation, the current 316 flows into the leads 352c, 352d, which are coupled in parallel, through the current conductor portion 354, and out of the leads 352a, 352b, which are also coupled in parallel. The current 316 flowing though the current conductor portion 354 generates a magnetic field, which is sensed by the Hall effect element 358 and by the two magnetoresistance elements 360a, 360b, providing a dual-level current sensor or an extended range current sensor in much the same fashion as described above for embodiments having two substrates.

In other embodiments, the magnetoresistance elements 360a, 360b can be replaced with vertical Hall effect elements.

As described above, the Hall effect element 358 and the magnetoresistance elements 360a, 360b are in very close proximity to the current conductor portion 354 and at a predetermined position relative to the current conductor portion 354 at which the magnetic field generated by the current is substantially aligned with the maximum response axis of the elements. This placement results in a greater voltage output from the Hall effect element 358 and from the magnetoresistance elements 360a, 360b, and therefore, greater sensitivity.

With this arrangement, it will be appreciated that the current flowing through the current conductor portion 354 splits between the first and second current conductor portions 354a, 354b, respectively.

While the lead frame 352 is shown to have the bent leads 352a-352h suitable for surface mounting to a circuit board, it will be appreciated that a lead frame having leads with other shapes can also be used, including but not limited to, through hole leads having a straight shape.

While only one Hall effect element 358 is shown on the first surface 356a of the substrate 356, it will be appreciated that more than one Hall effect element can be used. Furthermore, while two magnetoresistance elements 360a, 360b are shown, it will be appreciated that more than two or fewer than two magnetoresistance elements can be used. Other circuitry, for example an amplifier, can also be diffused on or otherwise coupled to or supported by the first and/or second surfaces 356a, 356b of the substrate 356.

While five solder balls 320a-320e are shown, any number of solder balls can be provided, including dummy solder balls for stabilizing the substrate 356. Also, while solder balls 320a-320e are shown, other connection methods can also be used, including, but not limited to gold bumps, eutectic or high lead solder humps, no-lead solder bumps, gold stud bumps, polymeric conductive bumps, anisotropic conductive paste, conductive film, and wire bonds.

While the substrate is 356 is shown in a flip-chip arrangement, in other embodiments, the substrate 356 can be conventionally mounted such that the first surface 356a is above the second surface 356b when the integrated circuit 350 is normally mounted to an uppermost surface of a circuit board. With these arrangements, the first and second current conductor portions 354a, 354b, respectively, are each above the first surface 356a of the substrate 356.

The integrated circuits described above in conjunction with FIGS. 1, 1A, 2, 2A, 3, 3A, 4, 5A, 5 and 5A are discussed as used in current sensors, wherein the various magnetic field sensing elements disposed thereon are responsive to a magnetic field generated by a current passing through a conductor. However, in other arrangements, the integrated circuits are used in magnetic field sensors, responsive to a magnetic field external to the integrated circuits. In still other arrangements, the integrated circuits are used in proximity sensors, responsive to a magnetic field associated with a moving ferrous object, or other soft magnetic material, for example, a rotating gear. In still other arrangements, the integrated circuits are used in proximity sensors, responsive to a magnetic field generated by a moving permanent magnet, or hard magnetic object. In still other arrangements, the integrated circuits are used in isolators, responsive to a pulse signal in a conductor or coil.

The integrated circuits described above in conjunction with FIGS. 1, 1A, 2, 2A, 3, 3A, 4, 4A, 5 and 5A are described as having two magnetic field sensing elements disposed on two substrates. However, in other embodiments, instead of having two substrates, an integrated circuit can have but one substrate, wherein the doping, and/or material of the two magnetic field sensing elements are different. For example, in some embodiments, a region of a single Si substrate can be implanted with Ge to create a SiGe Hall effect element, while a separate Si Hall effect element can be formed elsewhere on the same substrate. With these arrangements, the two magnetic field sensing elements can have different sensitivities or can have the same sensitivity.

Described above in conjunction with FIGS. 1, 1A, 2, 2A, 3, 3A, 4, 4A, 5, and 5A, electronic components 18, 56, 118, 158, and 220, respectively, can be disposed on surfaces of respective substrates. The electronic components can be comprised of circuits described in U.S. patent application Ser. No. 11/336,602, filed on Jan. 20, 2006, entitled "Current Sensor," having inventors Michael C. Doogue, Vijay Mangtani, and William P. Taylor, which application is incorporated by reference in its entirety.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. An integrated circuit, comprising:
   a lead frame;
   a first substrate having first and second opposing surfaces, wherein the first substrate is coupled to the lead frame such that the second surface of the first substrate is above the lead frame and the first surface of the first substrate is above the second surface of the first substrate;
   a second substrate having first and second opposing surfaces, wherein the second substrate is coupled to the lead frame such that the second surface of the second substrate is above the lead frame and the first surface of the second substrate is above the second surface of the second substrate;
   an electronic component disposed on the first surface of the first substrate;
   a first magnetic field sensing element disposed on the first surface of the second substrate; and
   a second magnetic field sensing element disposed on the first surface of the first substrate, wherein the first magnetic field sensing element provides a first sensitivity to a magnetic field, wherein the second magnetic field sensing element provides a second different sensitivity to the magnetic field, and wherein the integrated circuit is configured to provide a first operating range responsive to the first magnetic field sensing element and a second different operating range responsive to the second magnetic field sensing element.

2. The integrated circuit of claim 1, further comprising a conductor, wherein the integrated circuit is adapted to be responsive to magnetic field generated by a current passing through the conductor.

3. The integrated circuit of claim 1, further including a flux concentrator disposed proximate to at least one of the first magnetic field sensing element or the second magnetic field sensing element.

4. The integrated circuit of claim 1, wherein the first substrate is comprised of a selected one of Si, GaAs, InP, InSb, InGaAs, InGaAsP, Site, ceramic, or glass and the second substrate is comprised of a selected one of Si, GaAs, InP, InSb, InGaAs, InGaAsP, Site, ceramic, or glass.

5. The integrated circuit of claim 1, wherein the first surface of the second substrate is coupled to the first surface of the first substrate with a wire bond.

6. The integrated circuit of claim 5, further including at least one flux concentrator disposed proximate to at least one of the first magnetic field sensing element or the second magnetic field sensing element.

7. The integrated circuit of claim 1, wherein the lead frame further comprises a plurality of leads, wherein at least two of the plurality of leads are coupled to form a current conductor portion, wherein the current conductor portion is disposed proximate to the second substrate, and wherein the integrated circuit is responsive to a current flowing through the current conductor portion.

8. The integrated circuit of claim 1, further comprising:
   a current conductor disposed proximate to the second substrate; and
   a flux concentrator shaped so that a first portion of the flux concentrator is disposed under the lead frame and a second portion of the flux concentrator is disposed above the first surface of the second substrate.

9. The integrated circuit of claim 1, wherein the first and second magnetic field sensing elements are different types of magnetic field sensing elements.

* * * * *

UNITED STATES PATENT AND TRADEMARK OFFICE
CERTIFICATE OF CORRECTION

Page 1 of 2

PATENT NO. : 8,952,471 B2
APPLICATION NO. : 13/918064
DATED : February 10, 2015
INVENTOR(S) : Michael C. Doogue et al.

It is certified that error appears in the above-identified patent and that said Letters Patent is hereby corrected as shown below:

In the specification,

Column 1, Line 7 delete "application" and replace with --application is a--.

Column 1, Line 31 delete "elements" and replace with --element--.

Column 2, Line 36 delete "second surface of the second surface" and replace with --second surface of the second substrate--.

Column 3, Line 51 delete "includes first" and replace with --includes a first--.

Column 10, Line 50-51 delete "substrates" and replace with --substrate--.

Column 11, Line 44 delete ", of a solder" and replace with --, a solder--.

Column 15, Line 6 delete "circuit" and replace with --circuits--.

Column 15, Line 30 delete "256" and replace with --256.--.

Column 15, Line 39 delete "associated." and replace with --associated screws.--.

Column 15, Line 57 delete "selected, based" and replace with --selected based--.

Column 15, Line 61 delete "remaneuce)." and replace with --remanence)--.

Column 17, Line 5 delete "though" and replace with --through--.

Column 17, Line 66 delete "electroplating, in" and replace with --electroplating. In--.

Column 18, Line 8 delete "though" and replace with --through--.

Column 18, Line 24 delete "though" and replace with --through--.

Signed and Sealed this
First Day of March, 2016

Michelle K. Lee
*Director of the United States Patent and Trademark Office*

CERTIFICATE OF CORRECTION (continued)
U.S. Pat. No. 8,952,471 B2

Column 19, Line 1 delete "substrate is 356" and replace with --substrate 356--.

Column 19, Line 10 delete "4, 5A, 5 and 5A" and replace with --4, 4A, 5 and 5A--.

In the claims,

Column 20, Line 25 delete "to magnetic" and replace with --to a magnetic--.